United States Patent
Nishihara et al.

(10) Patent No.: US 8,072,025 B2
(45) Date of Patent: Dec. 6, 2011

(54) NON-VOLATILE SEMICONDUCTOR STORAGE DEVICE AND METHOD OF MANUFACTURING THE SAME

(75) Inventors: Kiyohito Nishihara, Yokohama (JP); Fumitaka Arai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 372 days.

(21) Appl. No.: 12/244,174

(22) Filed: Oct. 2, 2008

(65) Prior Publication Data

US 2009/0090959 A1    Apr. 9, 2009

(30) Foreign Application Priority Data

Oct. 5, 2007   (JP) ................. 2007-262431

(51) Int. Cl.
*H01L 29/792* (2006.01)
(52) U.S. Cl. ............ 257/326; 257/324; 257/E21.679; 257/E29.309
(58) Field of Classification Search .......... 257/324, 257/326, E29.309, E21.679
See application file for complete search history.

(56) References Cited

U.S. PATENT DOCUMENTS

| 2006/0091556 A1 | 5/2006 | Shigeoka | |
| 2007/0158736 A1* | 7/2007 | Arai et al. | 257/315 |

FOREIGN PATENT DOCUMENTS

JP    7-202143    8/1995

OTHER PUBLICATIONS

U.S. Appl. No. 12/508,904, filed Jul. 24, 2009, Kamigaichi, et al.
U.S. Appl. No. 12/562,558, filed Sep. 18, 2009, Nishihara.

* cited by examiner

*Primary Examiner* — Matthew Landau
*Assistant Examiner* — Daniel Luke
(74) *Attorney, Agent, or Firm* — Oblon, Spivak, McClelland, Maier & Neustadt, L.L.P.

(57) ABSTRACT

A first lamination part includes: a charge accumulation layer provided on the respective sidewalls of laminated first conductive layers and accumulating charges; and a first semiconductor layer provided in contact with the fourth insulation layer and formed to extend to the lamination direction. A second lamination part includes a second semiconductor layer provided in contact with the first semiconductor layer. A third lamination part includes: a plurality of first contact layers formed in contact with the respective second lamination part, extending to a first direction perpendicular to the lamination direction, and in line with each other along a second direction perpendicular to the first direction; and a plurality of contact plug layers formed in contact with any one of the first contact layers and extending to the lamination direction. The contact plug layers are arranged at different positions relative to each other in the first direction.

5 Claims, 19 Drawing Sheets

Boundary

NON-VOLATILE SEMICONDUCTOR STORAGE DEVICE AND METHOD OF MANUFACTURING THE SAME

CROSS-REFERENCE TO RELATED APPLICATIONS

This application is based upon and claims the benefit of priority from the prior Japanese Patent Application No. 2007-262431, filed on Oct. 5, 2007, the entire contents of which are incorporated herein by reference.

BACKGROUND OF THE INVENTION

1. Field of the Invention

The present invention relates to an electrically rewritable non-volatile semiconductor storage device and a method of manufacturing the same.

2. Description of the Related Art

Non-volatile semiconductor storage devices are configured by semiconductor layers with lamination structure including memory cell arrays. Generally, the semiconductor layers are provided with contact layers on their surfaces that are connected to conductive layers within the semiconductor layers. The contact layers are connected by wiring layers and contact plugs.

According to a trend in the non-volatile semiconductor storage devices, the number of bits tends to increase for the purpose of providing a larger amount of data to be written to one chip. This is achieved by shrinking the area occupied by the semiconductor layers. One example structure achieving such shrinkage in occupation area is described in, e.g., Japanese Patent Laid-Open No. 2006-128390.

However, the smaller the area occupied by the semiconductor layers, the more refined the contact layers required. This would more likely cause short circuits between contact plugs formed in a contact layer. That is, this may lead to a malfunction. On the contrary, while some measures are taken to solve this problem by decreasing the radius of contact plugs, these measures would result in reduction in an alignment margin for contact plugs and contact layers. In addition, the smaller radius of contact plugs, the more difficult it becomes to process them and the higher resistance provided therein.

SUMMARY OF THE INVENTION

One aspect of the present invention provides a non-volatile semiconductor storage device comprising: a first lamination part having first insulation layers and first conductive layers alternately laminated therein; a second lamination part provided on either the top or bottom surface of the respective first lamination part and laminated so as to form a second conductive layer between second insulation layers; and a third lamination part located on either the respective first or second lamination part, the first lamination part comprising: a third insulation layer provided in contact with the respective sidewalls of the first insulation layers and the first conductive layers; a charge accumulation layer provided in contact with the third insulation layer and accumulating charges; a fourth insulation layer provided in contact with the charge accumulation layer; and a first semiconductor layer provided in contact with the fourth insulation layer and formed to extend to the lamination direction, the second lamination part comprising: a fifth insulation layer provided in contact with the respective sidewalls of the second insulation layers and the second conductive layer; and a second semiconductor layer provided in contact with the fifth insulation layer and the first semiconductor layer and formed to extend to the lamination direction, the third lamination part comprising: a plurality of first contact layers formed in contact with the respective second lamination part, extending to a first direction perpendicular to the lamination direction, and in line with each other along a second direction perpendicular to the first direction; and a plurality of contact plug layers formed in contact with any one of the first contact layers and extending to the lamination direction, wherein the contact plug layers are arranged at different positions relative to each other in the first direction.

Another aspect of the present invention provides a method of manufacturing a non-volatile semiconductor storage device, the method comprising: laminating a plurality of first conductive layers on a substrate in the lamination direction via first insulation layers; forming second conductive layers on the first conductive layers via second insulation layers; forming first trenches extending to a first direction perpendicular to the lamination direction to penetrate the first insulation layers, the first conductive layers, the second insulation layers, and the second conductive layer; sequentially forming a third insulation layer, a charge accumulation layer, and a fourth insulation layer on the sidewalls of the first conductive layers facing the first trenches; forming a fifth insulation layer on the sidewall of the second conductive layer facing the first trenches; forming a semiconductor layer in contact with the fourth insulation layer and the fifth insulation layer facing the first trenches; after forming the semiconductor layer, forming second trenches extending to a second direction perpendicular to the lamination direction and the first direction, spaced apart by a predetermined pitch in the first direction, to penetrate the first insulation layers, the first conductive layers, the second insulation layers, and the second conductive layer; forming first contact layers in contact with the top surface of the semiconductor layer and extending to the second direction; and forming a contact plug layer in contact with any one of the first contact layers and extending to the lamination direction, wherein the contact plug layers are formed to be arranged at different positions relative to each other in the second direction.

DETAILED DESCRIPTION OF THE EMBODIMENTS

Embodiments of a non-volatile semiconductor storage device according to the present invention will now be described below with reference to the accompanying drawings.

First Embodiment

Circuit Configuration of Non-Volatile Semiconductor Storage Device According to First Embodiment Referring first to FIG. 1, a circuit configuration of the non-volatile semiconductor storage device will be described below. The non-volatile semiconductor storage device according to the first embodiment is a so-called NAND-type flash memory.

Figure 1:
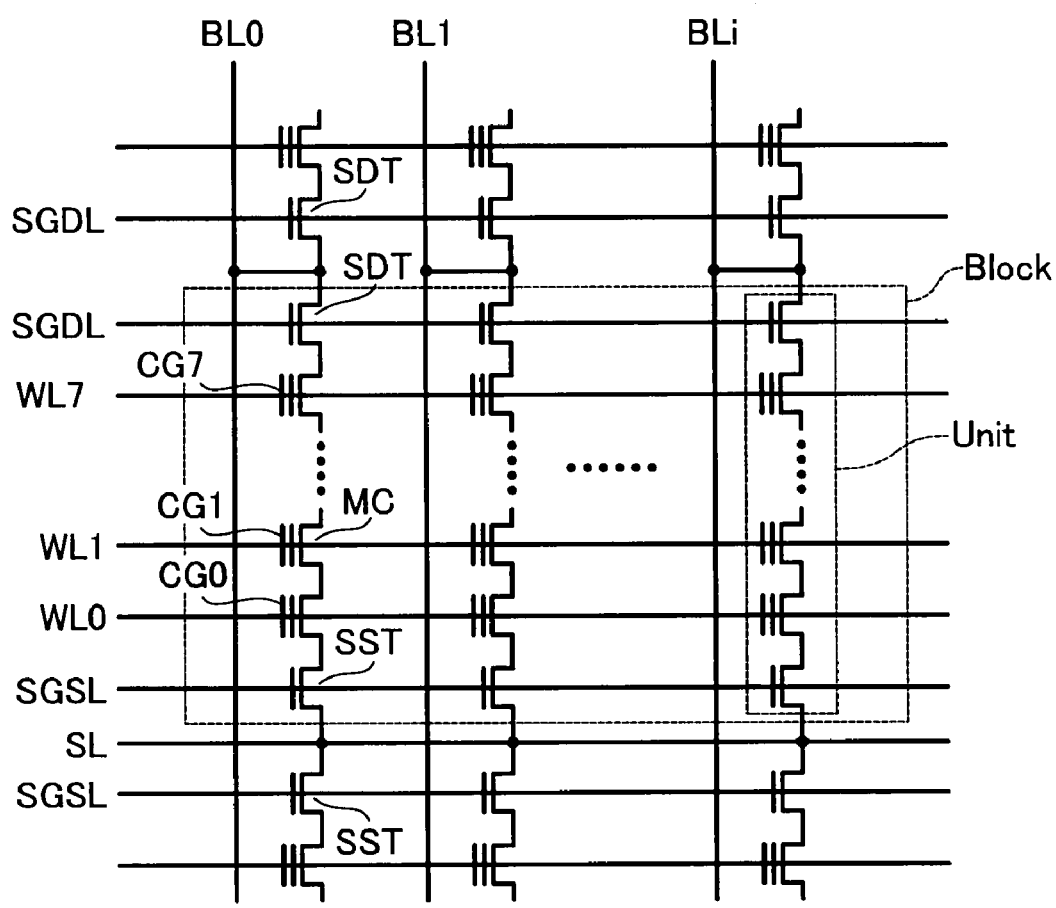
FIG. 1 is a circuit diagram of a non-volatile semiconductor storage device according to a first embodiment of the present invention.

As illustrated in FIG. 1, one unit which is a unit of erasing data includes a plurality of memory cells MC connected in series to each other, a source-side selection transistor SST connected in series to one end (source side) of the memory cells MC, and a drain-side selection transistor SDT connected in series to the other end (drain side) of the memory cells MC. Note that, in the example of FIG. 1, eight memory cells MC are connected in series. In addition, while the eight memory cells MC are illustrated in FIG. 1, it may of course be possible to provide any other number of memory cells.

Word lines WL are connected to control gates CG0 to CG7 of the memory cell transistors as the memory cells MC. The gate terminal of the source-side selection transistor SST is connected to a source-side selection gate line SGSL. The source terminal of the source-side selection transistor SST is connected to a source line SL. The gate terminal of the drain-side selection transistor SDT is connected to a drain-side selection gate line SGDL. The drain terminal of the drain-side selection transistor SDT is connected to a bit line BL.

The source-side selection gate line SGSL and the drain-side selection gate line SGDL are used to on-off control the selection transistors SST and SDT. The source-side selection transistor SST and the drain-side selection transistor SDT function as the gates for supplying a predetermined potential to the memory cells MC in the unit, e.g., when writing and reading data.

A plurality of such units are arranged in the row direction (to which the word lines extend) to configure one block. Those memory cells that are connected to the same word line in one block are taken as one page and data writing and reading operations are performed on a per page basis.

Multiple blocks are arranged in the column direction (to which the bit lines extend). In addition, respective multiple blocks are arranged in an folded structure. That is, any one block and another block adjacent to one end thereof have respective drain-side selection transistors SDT arranged adjacent to each other. The one block and still another block adjacent to the other end thereof have respective source-side selection transistors SST arranged in adjacent to each other.

Figure 2A:
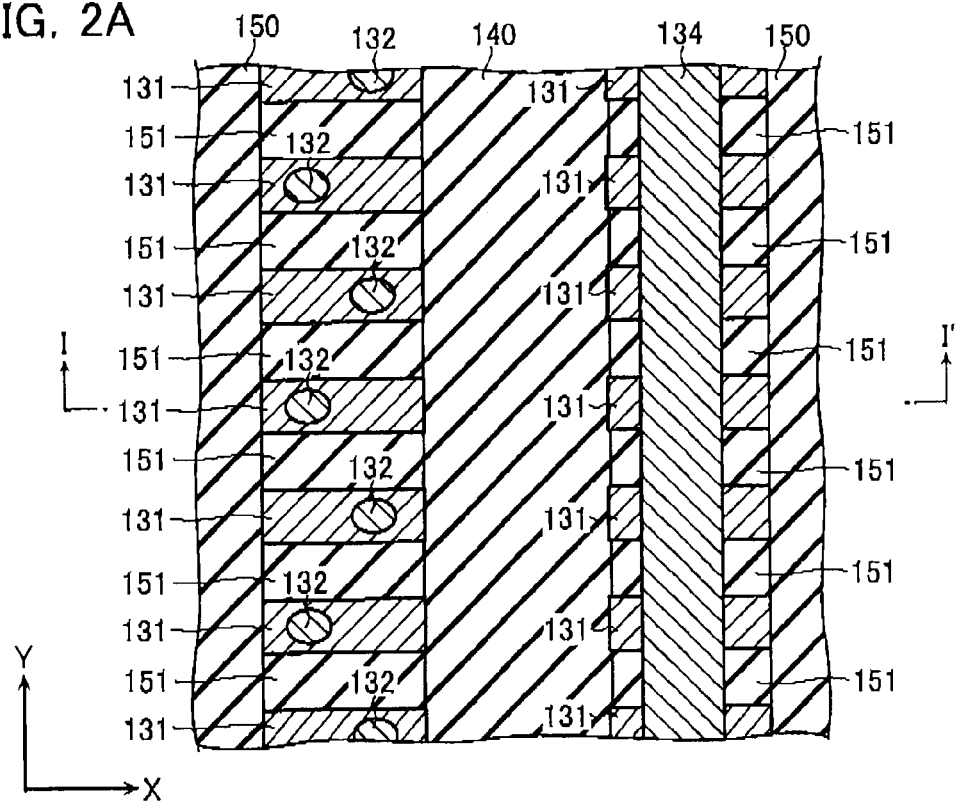
FIG. 2A is a top plan view illustrating a specific configuration of the non-volatile semiconductor storage device according to the first embodiment of the present invention.
Figure 2B:
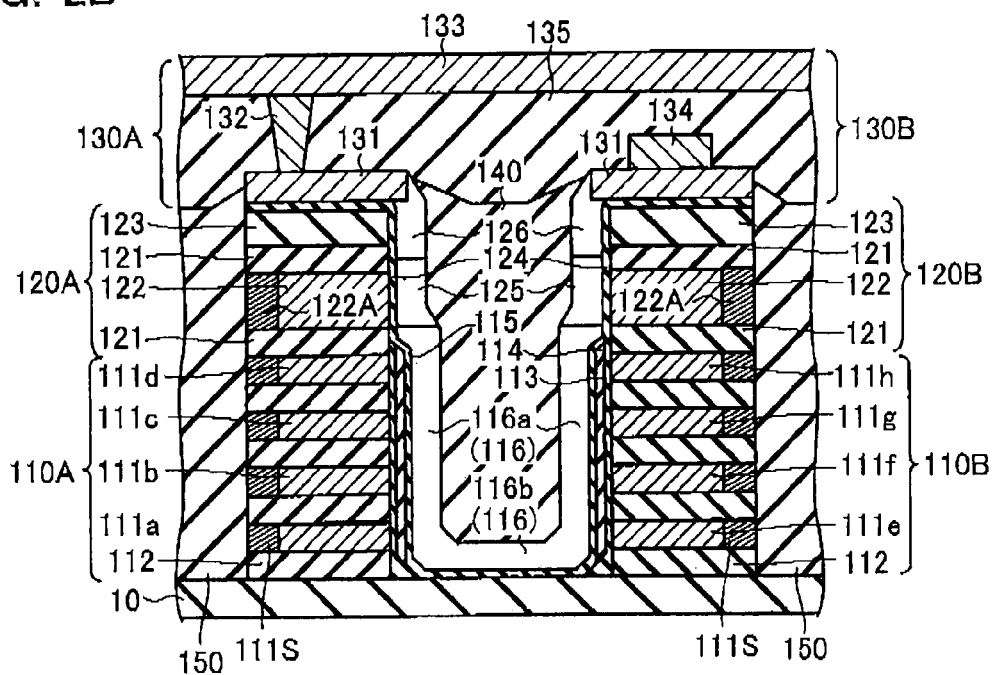
FIG. 2B is a cross-sectional view, taken along line I-I' of FIG. 2A, illustrating a specific configuration of the non-volatile semiconductor storage device according to the first embodiment of the present invention.

Specific Configuration of Non-Volatile Semiconductor Storage Device According to First Embodiment Referring now to FIGS. 2A and 2B, a specific configuration of the non-volatile semiconductor storage device according to the first embodiment will be described below. FIG. 2A is a top plan view of the non-volatile semiconductor storage device according to the first embodiment; and FIG. 2B is a cross-sectional view taken along line I-I' of FIG. 2A. Note that a bit line BL (a wiring layer 133, discussed below) provided above these areas and an insulation layer 135, which will be later described, are omitted from FIG. 2A. In FIGS. 2A and 2B, consider that one direction to which the bit lines BL extend represents the x direction and the other to which the source line SL (a wiring layer 134, discussed below) extends represents the y direction.

As illustrated in FIGS. 2A and 2B, the non-volatile semiconductor storage device according to the first embodiment is a NAND-type flash memory with a SOI (Silicon On Insulator) structure. In addition, vertical memory cell transistors and vertical selection transistors are used as the memory cells MC and the selection transistors SST and SDT of the first embodiment. Note that vertical transistors represent those transistors with channels formed in the vertical direction (lamination direction).

In the non-volatile semiconductor storage device, a pair of first lamination parts 110A and 110B are formed on the substrate 10. A second lamination part 120A and a third lamination part 130A are laminated on the first lamination part 110A. Similarly, a second lamination part 120B and a third lamination part 130B are laminated on a first lamination part 110B. Note that the first lamination part 110A (the second lamination part 120A and the third lamination part 130A) and the first lamination part 110B (the second lamination part 120B and the third lamination part 130B) are formed to be spaced apart by a predetermined distance in the x direction.

Insulation layers 140 and 150 are deposited around the circumference of the first lamination part 110A (the second lamination part 120A and the third lamination part 130A) and the first lamination part 110B (the second lamination part 120B and the third lamination part 130B).

The first lamination part 110A is formed with alternately laminated first interlayer insulation layers (first insulation layers) 112 and first conductive layers 111a to 111d (from the bottom). The first lamination part 110B is formed with alternately laminated first interlayer insulation layers (first insulation layers) 112 and first conductive layers 111e to 111h (from the bottom). The first conductive layers 111a to 111h function as the control gates CG0 to CG7 of the memory cells MC mentioned above.

In addition, each of the first lamination parts 110A and 110B has a block insulation layer (third insulation layer) 113, a charge accumulation layer 114, a tunnel insulation layer (fourth insulation layer) 115, and an n⁻ type semiconductor layer (first semiconductor layer) 116, in a respective side surface where each of the first lamination parts 110A and 110B faces each other through the insulation layer 140, which will be later described.

For example, polysilicon is used for the first conductive layers 111a to 111h. In addition, tantalum (Ta), tungsten (W), aluminum (Al), copper (Cu) or the like may be used to lower the resistance of the control gates. The first conductive layers 111a to 111d and the first conductive layers 111e to 111h have silicide layers 111S at their respective ends opposed to the end where the first lamination parts 110A and 110B face each other in the x direction.

For example, silicon oxide ($SiO_2$) is used for the first interlayer insulation layers 112. Alternatively, BPSG (Boron Phosphorus Silicate Glass) including boron (B) or phosphorus (P) in silicon oxide, BSG (Boron Silicate Glass), PSG (Phosphorus, Silicate Glass) or the like.

The block insulation layer 113 is formed in contact with the respective sidewalls of the first conductive layers 111a to 111h and the first interlayer insulation layers 112. The block insulation layer 113 prevents charges accumulated in the charge accumulation layer 114 from being diffused into the gate electrodes. For example, silicon oxide ($SiO_2$) or Alumina ($Al_2O_3$) is used for the block insulation layer 113. The block insulation layer 113 has a film thickness on the order of 10-20 nm.

The charge accumulation layer 114 is provided in contact with the block insulation layer 113 and formed to accumulate charges. For example, silicon nitride (SiN) is used for the charge accumulation layer 114. The charge accumulation layer 114 has a film thickness on the order of 4-10 nm.

The tunnel insulation layer 115 is provided in contact with the charge accumulation layer 114. The tunnel insulation layer 115 become potential barriers when charges from the n⁻ type semiconductor layer 116 are accumulated in the charge accumulation layer 114 or when the charges accumulated in the charge accumulation layer 114 are diffused into the n type semiconductor layer 116. For example, silicon oxide ($SiO_2$) is used for the tunnel insulation layer 115. Silicon oxide is preferable for its better insulating properties than silicon nitride and its functionality of preventing charge diffusion. The tunnel insulation layer 115 has a film thickness on the order of 4 nm.

That is, the block insulation layer 113, the charge accumulation layer 114, and the tunnel insulation layer 115 together configure oxide-film, nitride-film, oxide-film, for example, ANO laminated film, or ONO laminated film.

The n⁻ type semiconductor layer 116 has a U-shaped cross-section in the direction of I-I'. That is, the n⁻ type semiconductor layer 116 has side parts 116a, 116a that are provided in contact with each tunnel insulation layer 115 and formed to extend to the lamination direction (in a pillar-like fashion), and a bottom part 116b that is formed to connect the bottom portions of the pair of side parts 116a, 116a. The side parts 116a, 116a are formed up to the top surfaces of second interlayer insulation layers 121 that are located in the lower part of second lamination parts 120A and 120B, as discussed below. Note that the n⁻ type semiconductor layer 116 is configured by a semiconductor layer to which a low-concentration n⁻ type impurity is implanted.

Each of the second lamination parts 120A and 120B has such a configuration where a second interlayer insulation layer 121, a second conductive layer 122, another second interlayer insulation layer 121, and a third interlayer insulation layer 123 are sequentially laminated therein. In other words, each second conductive layer 122 is laminated between the two second interlayer insulation layers 121. One second conductive layer 122 in the second lamination part 120A functions as a drain-side selection gate line SGDL of a drain-side selection transistor SDT. In addition, the other second conductive layer 122 in the second lamination part 120B functions as a source-side selection gate line SGSL of a source-side selection transistor SST.

In addition, each of the second lamination parts 120A and 120B has a gate insulation layer (fifth insulation layer) 124, a p⁻ type semiconductor layer (second semiconductor layer) 125, and an n⁺ type semiconductor layer 126, in a respective side surface where the second conductive layers 122 face each other through the insulation layer 140.

For example, polysilicon is used for the second conductive layers 122. In addition, tungsten (W), aluminum (Al), copper (Cu) or the like may be used to lower the resistance of the control gates. Each of the second conductive layers 122 has a silicide layer 122A at a respective end opposed to the end where the second lamination parts 120A and 120B face each other in the x direction.

For example, silicon oxide (SiO₂) is used for the second interlayer insulation layers 121. Alternatively, BPSG (Boron Phosphorus Silicate Glass) including boron (B) or phosphorus (P) in silicon oxide, BSG (Boron Silicate Glass), PSG (Phosphorus Silicate Glass) or the like.

The gate insulation layer 124 is provided in contact with the respective sidewalls of the second conductive layers 122, the second interlayer insulation layers 121, and the third interlayer insulation layers 123. The p⁻ type semiconductor layers 125 are provided in contact with the gate insulation layer 124 and the n⁻ type semiconductor layer 116, within a region from the bottom to the top surfaces of the second conductive layers 122 in the lamination direction. The p⁻ type semiconductor layers 125 are formed to extend to the lamination direction. The p⁻ type semiconductor layers 125 are semiconductor layers to which low-concentration p⁻ type impurities are implanted. The n⁺ type semiconductor layers 126 are provided in contact with the gate insulation layer 124 and the top surfaces of the p⁻ type semiconductor layers 125.

Each of the third lamination parts 130A and 130B has a contact layer 131 that is formed on the respective third interlayer insulation layer 123 via the respective tunnel insulation layer 115.

One end of each contact layer 131 is formed in contact with the upper portion of the respective n⁺ type semiconductor layer 126. Each contact layer 131 is formed in a rectangular plate shape extending to the x direction (the x direction as the longitudinal direction). In addition, the contact layers 131 are formed in line with each other along the y direction. Each contact layer 131 is configured by a silicide layer.

Further, the third lamination part 130A has contact plug layers 132 that are provided on the top surface of the contact layer 131 and a wiring layer 133 that is provided on the top surface of the contact plug layers 132.

Each contact plug layer 132 is formed on the top surface of one contact layer 131 and formed to extend to the lamination direction. As illustrated in FIG. 2A, the contact plug layers 132 are arranged at different positions (offset) relative to each other in the x direction, rather than arranged in a straight line along the y direction. In FIG. 2A, the contact plug layers 132 are arranged in a staggered fashion.

The wiring layer 133 is formed across, and in contact with, the top surfaces of the contact plug layers 132 in multiple second lamination parts 120A. The wiring layer 133 functions as the above-mentioned bit line BL.

In addition, the third lamination part 130B has a wiring layer 134 that is provided on the top surface of the other contact layer 131. The wiring layer 134 is formed on the top surface of the other contact layer 131. The wiring layer 134 is formed across, and in contact with, the top surfaces of the contact layers 131 in multiple second lamination parts 120B. The wiring layer 134 functions as the above-mentioned source line SL. Note that an insulation layer 135 is formed between the bottom surface of the wiring layer 133 and the insulation layers 140, 150.

Manufacturing Process of Non-Volatile Semiconductor Storage Device According to First Embodiment Referring now to FIGS. 3A, 4A, 5A, 6A, 7A, 8A, 9A, 9C, 10A, 11A, and 12A, as well as FIGS. 3B, 4B, 5B, 6B, 7B, 8B, 9B, 9D, 10B, 11B, and 12B, a manufacturing process of the non-volatile semiconductor storage device according to the first embodiment will be described below. FIGS. 3A, 4A, 5A, 6A, 7A, 8A, 9A, 9C, 10A, 11A, and 12A are top plan views in the manufacturing process; and FIGS. 3B, 4B, 5B, 6B, 7B, 8B, 9B, 9D, 10B, 11B, and 12B are cross-sectional views in the manufacturing process.

Figure 3A:
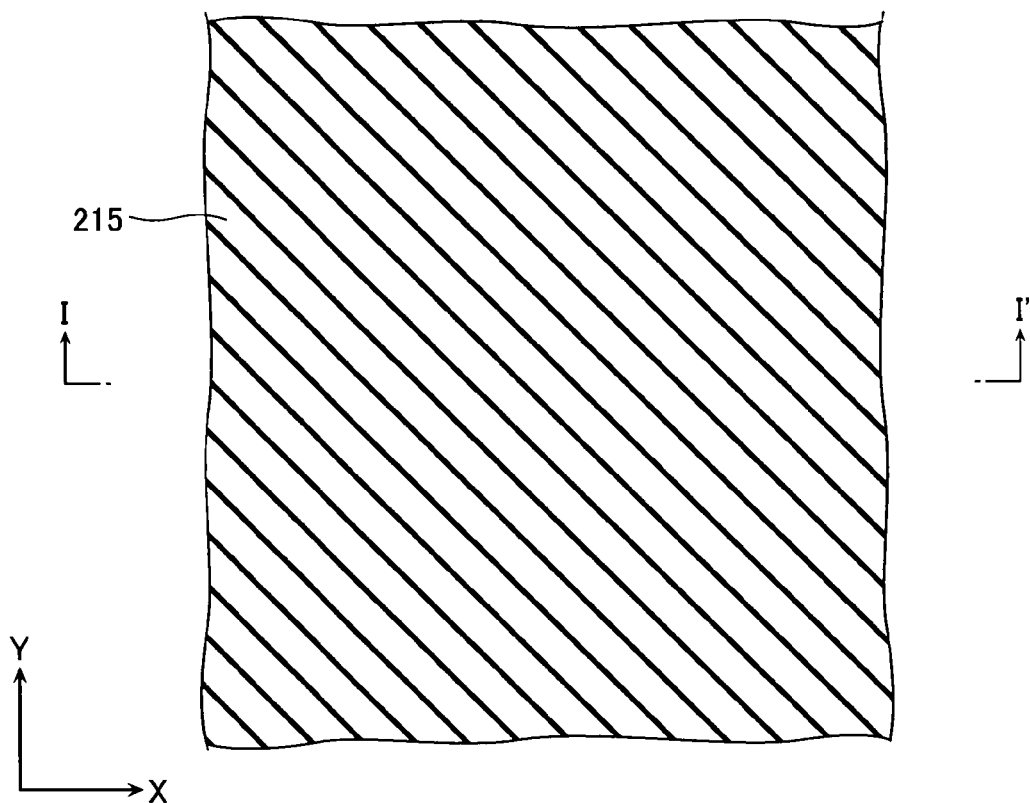
FIG. 3A is a top plan view illustrating a manufacturing process of the non-volatile semiconductor storage device according to the first embodiment of the present invention.
Figure 3B:
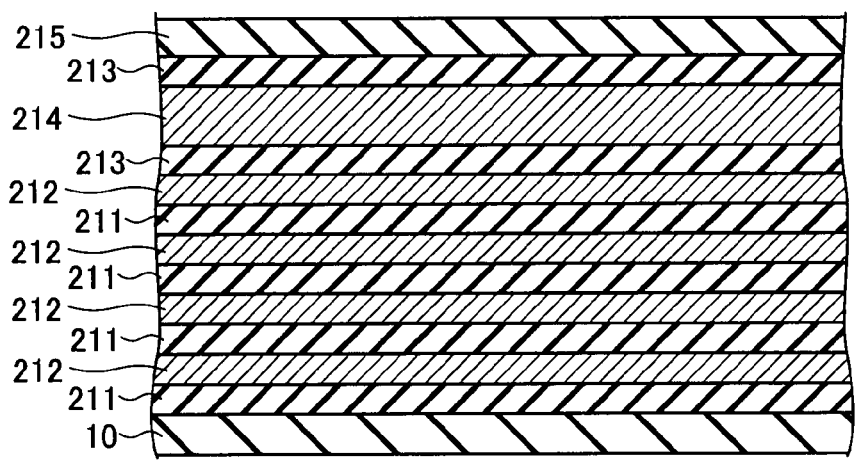
FIG. 3B is a cross-sectional view, taken along line I-I' of FIG. 3A, illustrating a manufacturing process of the non-volatile semiconductor storage device according to the first embodiment of the present invention.

Firstly, as illustrated in FIGS. 3A and 3B, interlayer insulation layers 211 and first conductive layers 212 are alternately laminated on the substrate 10. Then, an interlayer insulation layer 213, a second conductive layer 214, another interlayer insulation layer 213, and still another interlayer insulation layer 215 are sequentially deposited thereon.

Each of the interlayer insulation layers 211 and each of the first conductive layers 212 are subsequently processed to provide the first conductive layers 111a to 111h that function as the first interlayer insulation layers 112 and the control gates CG0 to CG7. In addition, the interlayer insulation layers 213 and the second conductive layer 214 are subsequently processed to provide the second interlayer insulation layers 121 and the second conductive layers 122 that function as the selection gate lines SGDL (SGSL) of the selection transistor.

For example, in the first embodiment, polysilicon is used for the first conductive layers 212 and the second conductive layer 214. In addition, for example, silicon oxide is used for the interlayer insulation layers 211 and the interlayer insulation layers 213, in which tungsten (W), aluminum (Al), copper (Cu) or the like may be used to lower the resistance of the control gates CG. Alternatively, BPSG (Boron Phosphorus Silicate Glass) including boron (B) or phosphorus (P) in silicon oxide, BSG (Boron Silicate Glass), PSG (Phosphorus Silicate Glass) or the like.

Figure 4A:
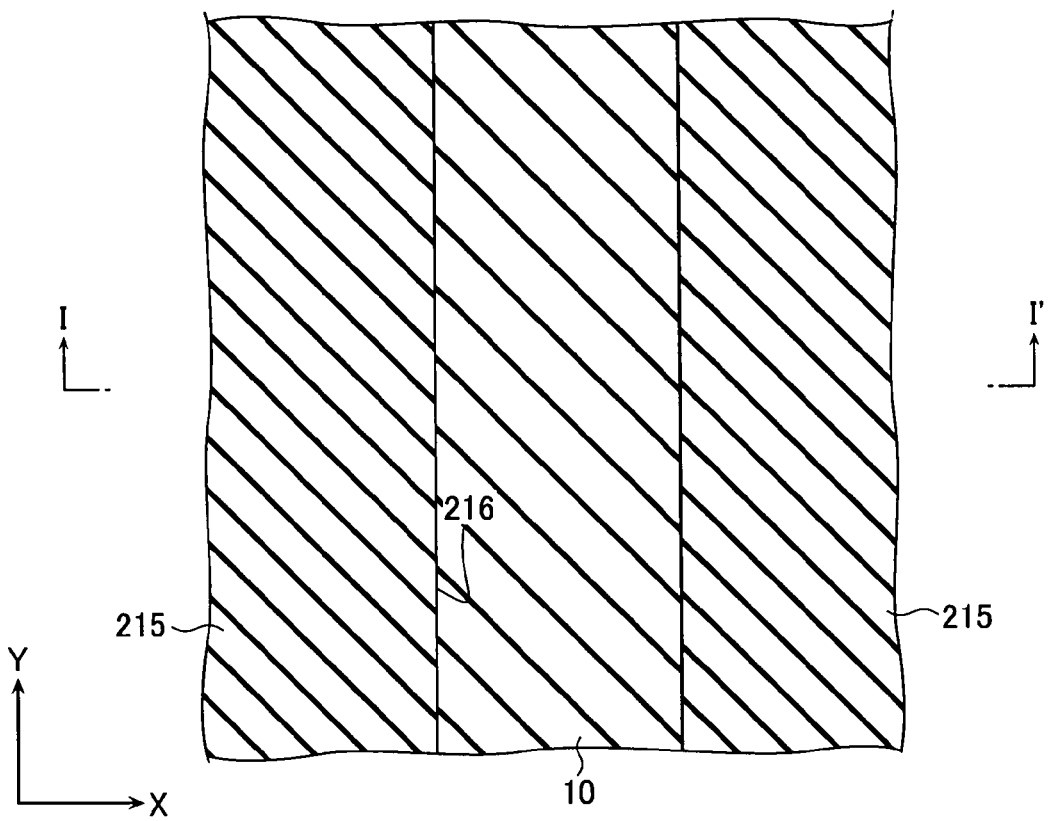
FIG. 4A is a top plan view illustrating a manufacturing process of the non-volatile semiconductor storage device according to the first embodiment of the present invention.
Figure 4B:
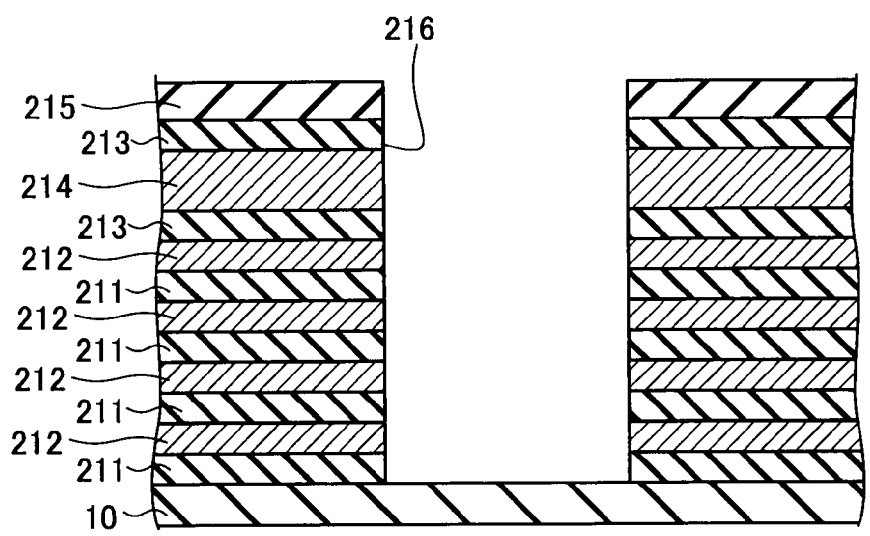
FIG. 4B is a cross-sectional view, taken along line I-I' of FIG. 4A, illustrating a manufacturing process of the non-volatile semiconductor storage device according to the first embodiment of the present invention.

Then, as illustrated in FIGS. 4A and 4B, the first conductive layers 212, the second conductive layer 214, and the interlayer insulation layers 211, 213, 215 are selectively etched using lithography and RIE (Reactive Ion Etching) methods. Then, an aperture 216 is formed to penetrate the laminated first conductive layers 212, second conductive layer 214, and interlayer insulation layers 211, 213, 215 so that the top surface of the substrate 10 is exposed.

Figure 5A:
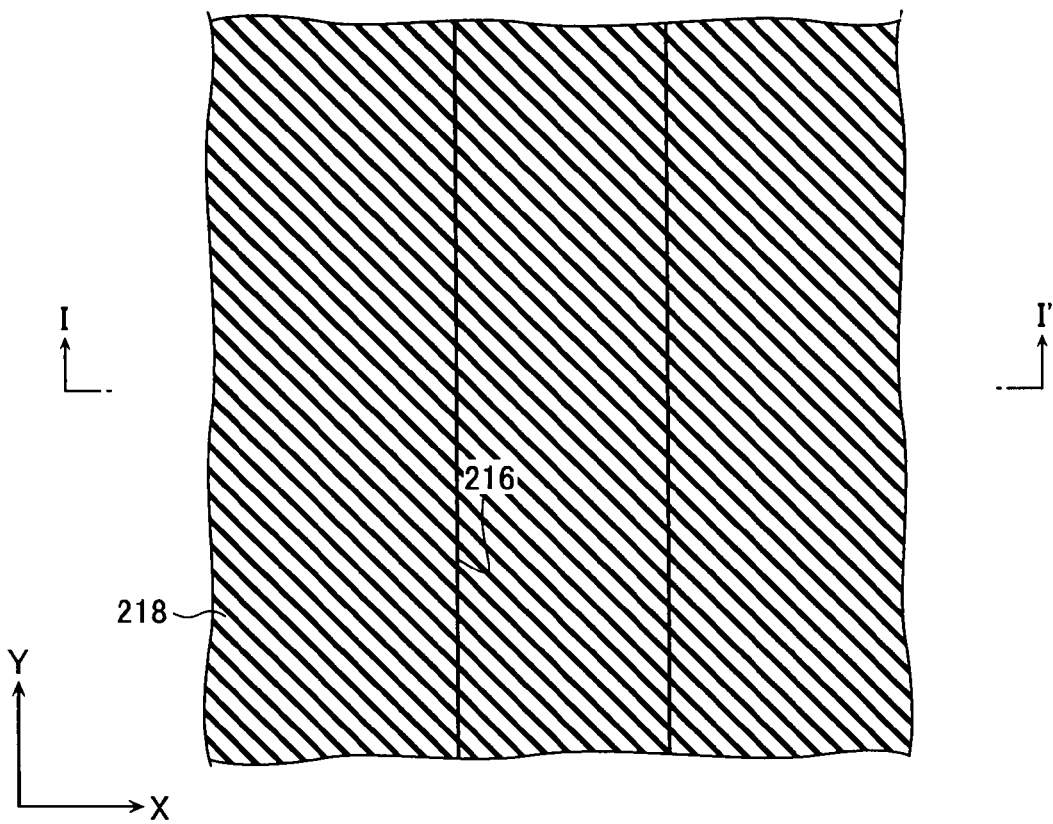
FIG. 5A is a top plan view illustrating a manufacturing process of the non-volatile semiconductor storage device according to the first embodiment of the present invention.
Figure 5B:
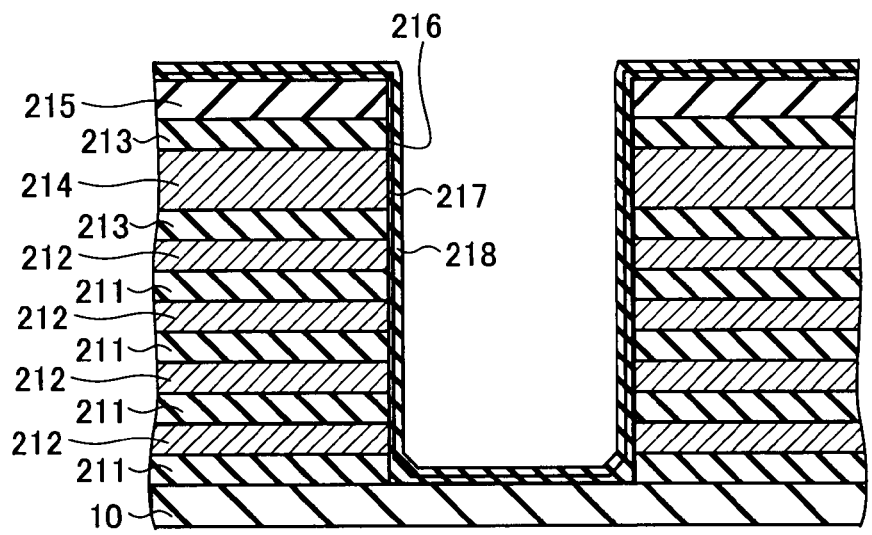
FIG. 5B is a cross-sectional view, taken along line I-I' of FIG. 5A, illustrating a manufacturing process of the non-volatile semiconductor storage device according to the first embodiment of the present invention.

Then, as illustrated in FIGS. 5A and 5B, a silicon oxide film 217 and a silicon nitride film 218 are sequentially deposited on the respective side surfaces, facing the aperture 216, of the first conductive layers 212, the second conductive layer 214, and the interlayer insulation layers 211, 213, 215. At this moment, the silicon oxide film 217 and the silicon nitride film 218 are also formed on the substrate 10 facing the aperture 216. Note that the silicon oxide film 217 and the silicon nitride film 218 are subsequently processed to provide the block insulation layer 113 and the charge accumulation layer 114.

Figure 6A:
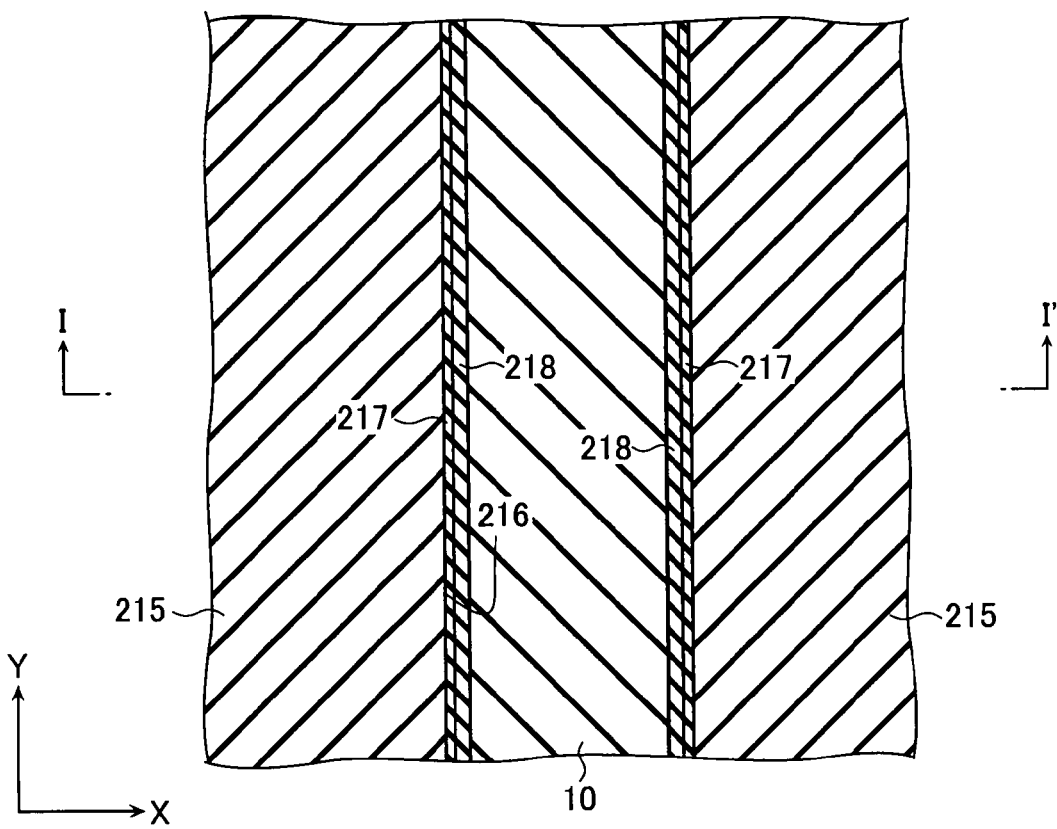
FIG. 6A is a top plan view illustrating a manufacturing process of the non-volatile semiconductor storage device according to the first embodiment of the present invention.
Figure 6B:
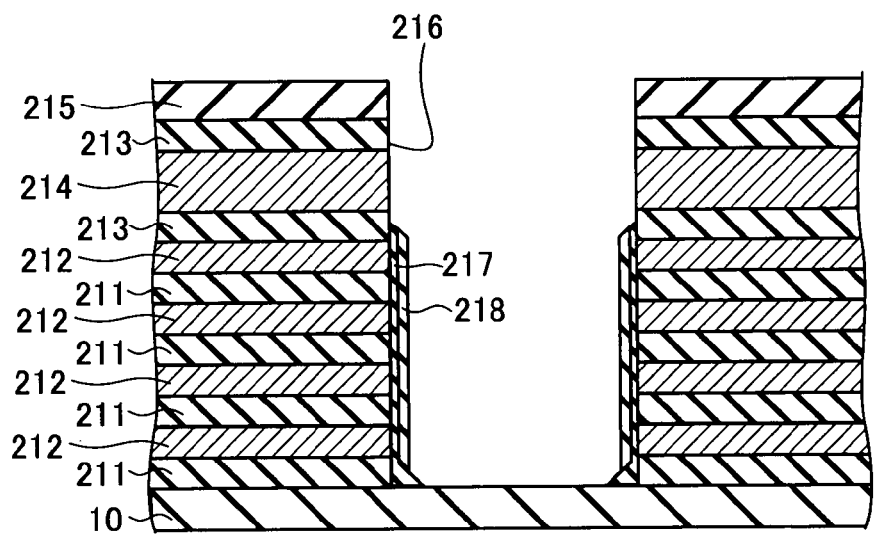
FIG. 6B is a cross-sectional view, taken along line I-I' of FIG. 6A, illustrating a manufacturing process of the non-volatile semiconductor storage device according to the first embodiment of the present invention.

Then, as illustrated in FIGS. 6A and 6B, the silicon nitride film 218 and the silicon oxide film 217 are removed using RIE to expose the top surfaces of the substrate 10 and the interlayer insulation layer 215. Through this RIE process, the silicon nitride film 218 and the silicon oxide film 217 remain only below the bottom surface of the second conductive layer 214 on the sidewall of the aperture 216.

Figure 7A:
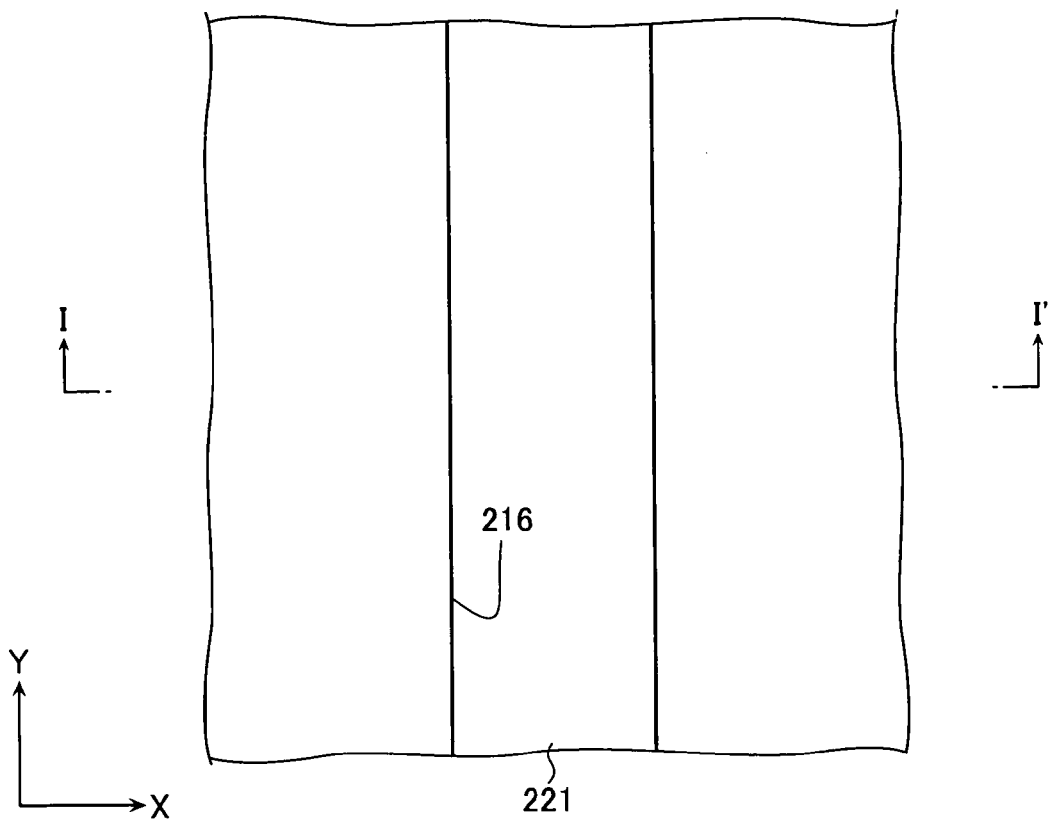
FIG. 7A is a top plan view illustrating a manufacturing process of the non-volatile semiconductor storage device according to the first embodiment of the present invention.
Figure 7B:
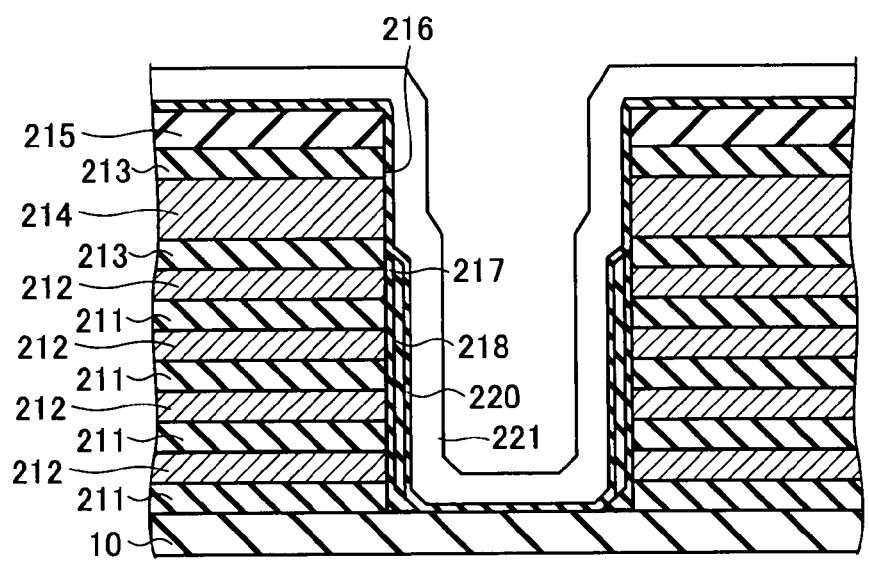
FIG. 7B is a cross-sectional view, taken along line I-I' of FIG. 7A, illustrating a manufacturing process of the non-volatile semiconductor storage device according to the first embodiment of the present invention.

Then, as illustrated in FIG. 7A and FIG. 7B, a silicon oxide film 220 is deposited on the silicon nitride film 218, the side surfaces of the interlayer insulation layers 213, 215, and the side surface of the second conductive layer 214. Note that the silicon oxide film 220 is subsequently processed to provide the gate insulation layer 124 and the tunnel insulation layer 115. Subsequently, an $n^-$ type semiconductor layer 221 is deposited on the silicon oxide film 220 and on its side surface. For the $n^-$ type semiconductor layer 221, such silicon is used to which a low-concentration $n^-$ type impurity (such as phosphorus (P) or arsenic (As)) is implanted. Note that the $n^-$ type semiconductor layer 221 becomes the $n^-$ type semiconductor layer 116 after the following process.

Figure 8A:
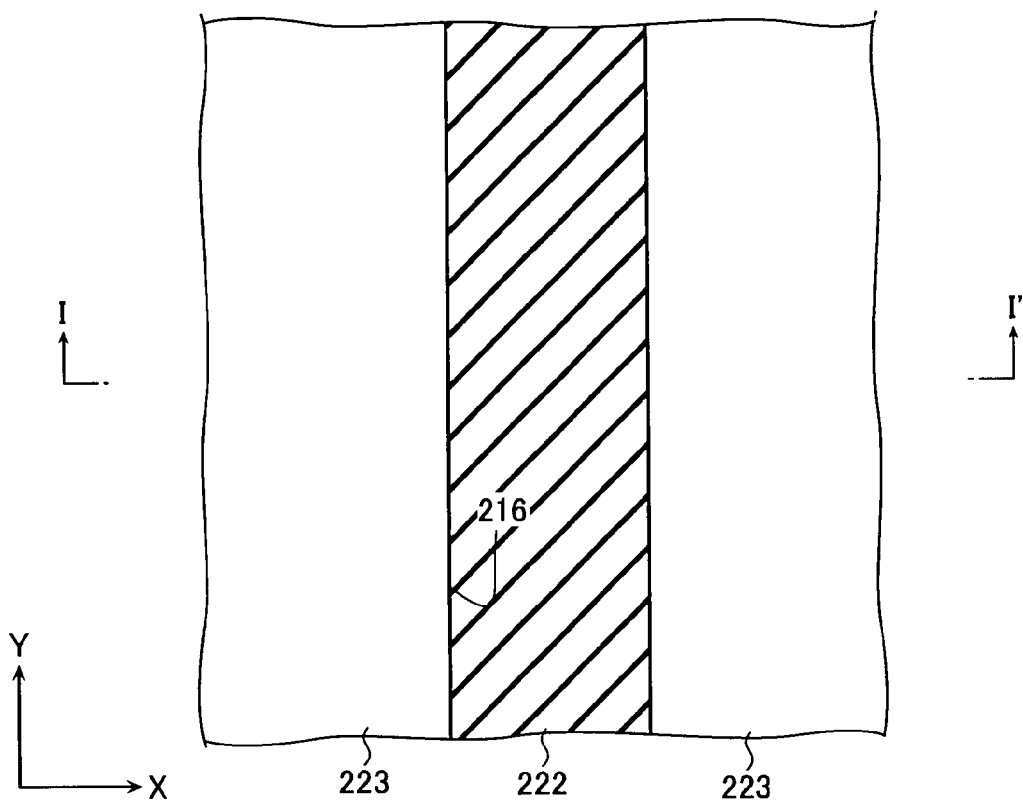
FIG. 8A is a top plan view illustrating a manufacturing process of the non-volatile semiconductor storage device according to the first embodiment of the present invention.
Figure 8B:
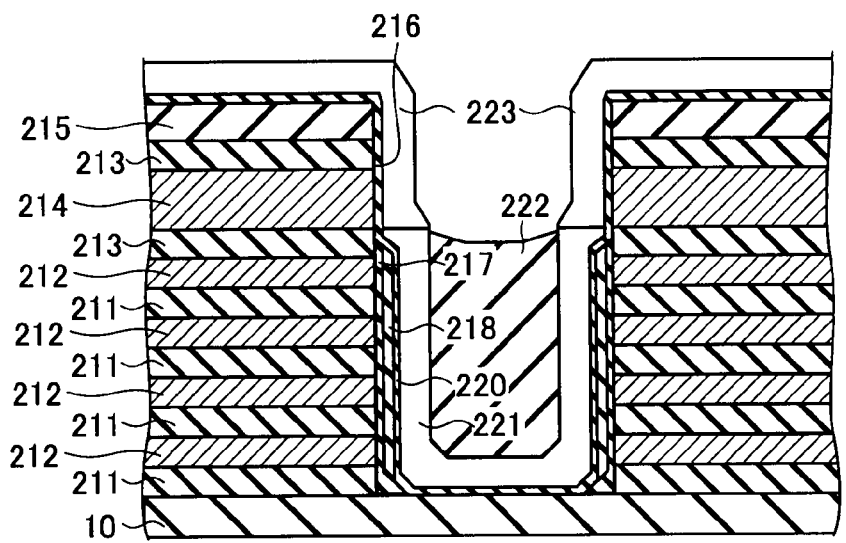
FIG. 8B is a cross-sectional view, taken along line I-I' of FIG. 8A, illustrating a manufacturing process of the non-volatile semiconductor storage device according to the first embodiment of the present invention.

Then, as illustrated in FIGS. 8A and 8B, an insulation layer 222 is deposited on the $n^-$ type semiconductor layer 221 so as to fill up the aperture 216. At this moment, the top surface of the insulation layer 222 is set at substantially the same position as the bottom surface of the second conductive layer 214. For example, silicon oxide is used for the insulation layer 222. Subsequently, a low-concentration p type impurity (such as boron (B)) is implanted to those portions of the $n^-$ type semiconductor layer 221 that are formed above the top surface of the insulation layer 222. As a result, $p^-$ type semiconductor layers 223, 223 are formed within the $n^-$ type semiconductor layer 221 above the top surface of the insulation layer 222, as channel regions of the selection transistors SST, SDT. That is, the $p^-$ type semiconductor layers 223, 223 become the $p^-$ type semiconductor layers 125, 125 after the following process.

Figure 9A:
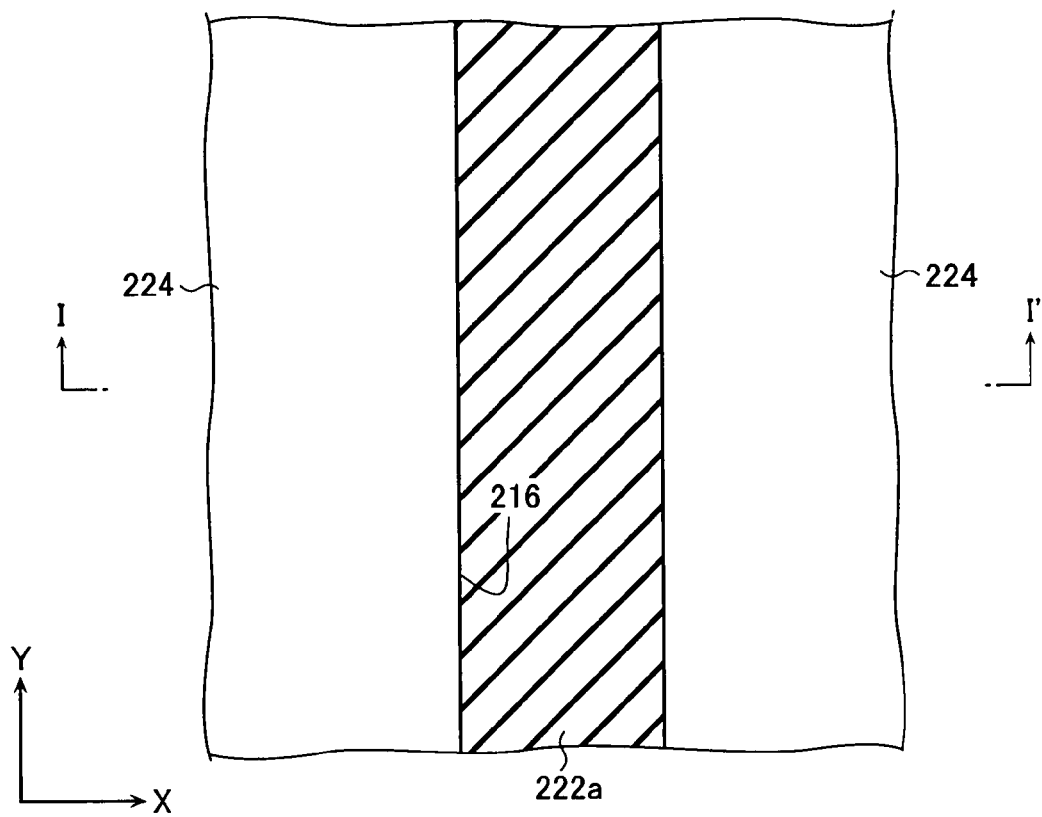
FIG. 9A is a top plan view illustrating a manufacturing process of the non-volatile semiconductor storage device according to the first embodiment of the present invention.
Figure 9B:
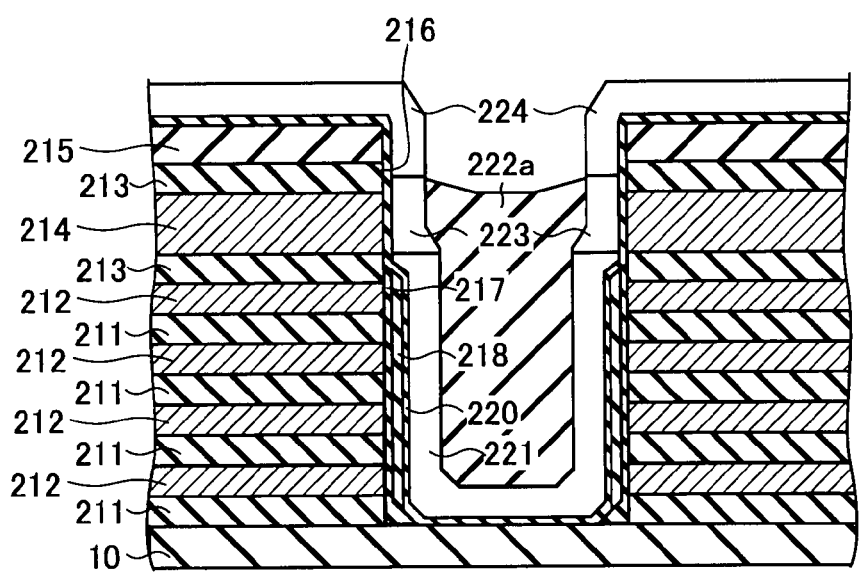
FIG. 9B is a cross-sectional view, taken along line I-I' of FIG. 9A, illustrating a manufacturing process of the non-volatile semiconductor storage device according to the first embodiment of the present invention.

Then, as illustrated in FIGS. 9A and 9B, an insulation layer 222a is further deposited on the insulation layer 222. At this moment, the top surface of the insulation layer 222a is set at substantially the same position as the top surface of the second conductive layer 214. Subsequently, high-concentration $n^+$ type impurities are implanted to those portions of the $p^-$ type semiconductor layers 223, 223 that are formed above the top surface of the insulation layer 222a. As a result, $n^+$ type diffusion layers 224, 224 are formed on the $p^-$ type semiconductor layers 223, 223 above the top surface of the insulation layer 222a, as source regions (drain regions) of the selection transistors SST (SDT). That is, the $n^+$ type diffusion layers 224, 224 become the $n^+$ type semiconductor layers 126, 126 after the following process.

Figure 9C:
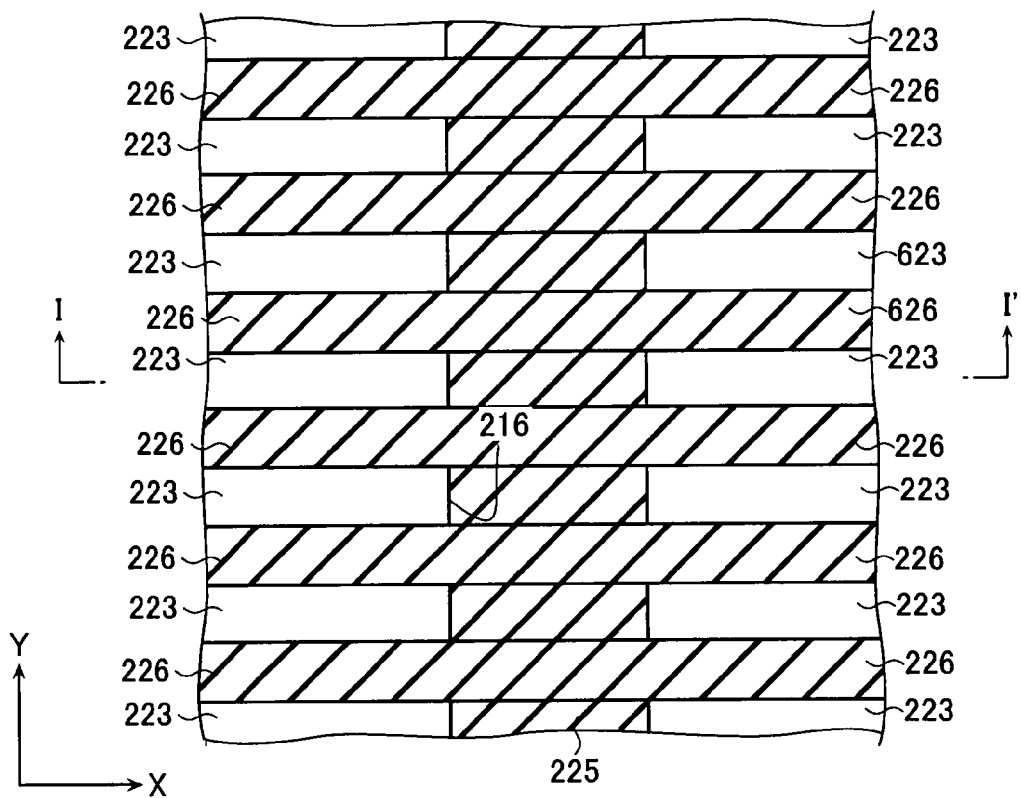
FIG. 9C is a top plan view illustrating a manufacturing process of the non-volatile semiconductor storage device according to the first embodiment of the present invention.
Figure 9D:
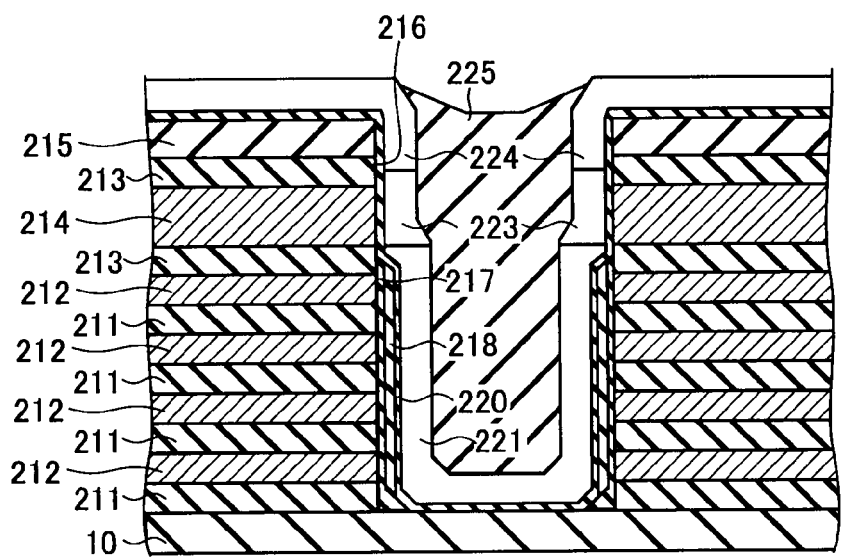
FIG. 9D is a cross-sectional view, taken along line I-I' of FIG. 9A, illustrating a manufacturing process of the non-volatile semiconductor storage device according to the first embodiment of the present invention.

Subsequently, as illustrated in FIGS. 9C and 9D, an insulation layer 225 is further formed on the side surfaces of the $n^+$ type semiconductor layers 224, 224. Then, the $n^-$ type semiconductor layer 221, the p type semiconductor layer 223, and the $n^+$ type diffusion layer 224 are etched in a stripe form by a predetermined pitch in the y direction in order to electrically separate these layers into multiple units. At this moment, the first conductive layers 212, the second conductive layer 214, and the interlayer insulation layers 211, 213, 215 are not etched and each layer remains in a layered form in the y direction. Thereafter, insulation layers 226 are laminated over the apertures formed by etching.

Figure 10A:
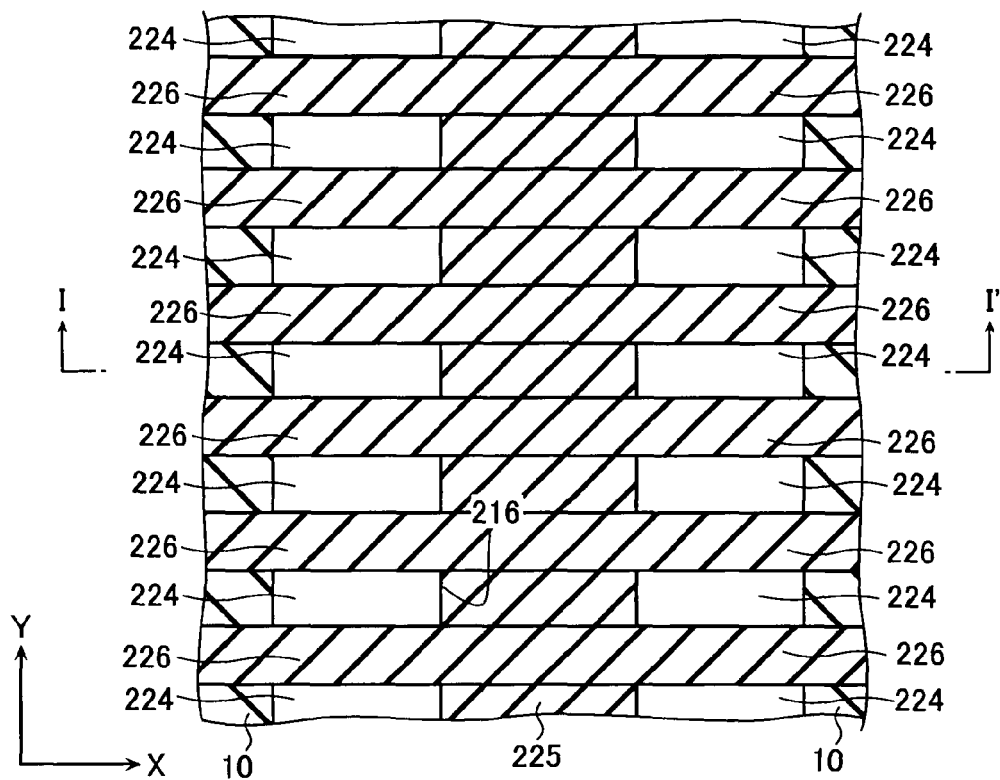
FIG. 10A is a top plan view illustrating a manufacturing process of the non-volatile semiconductor storage device according to the first embodiment of the present invention.
Figure 10B:
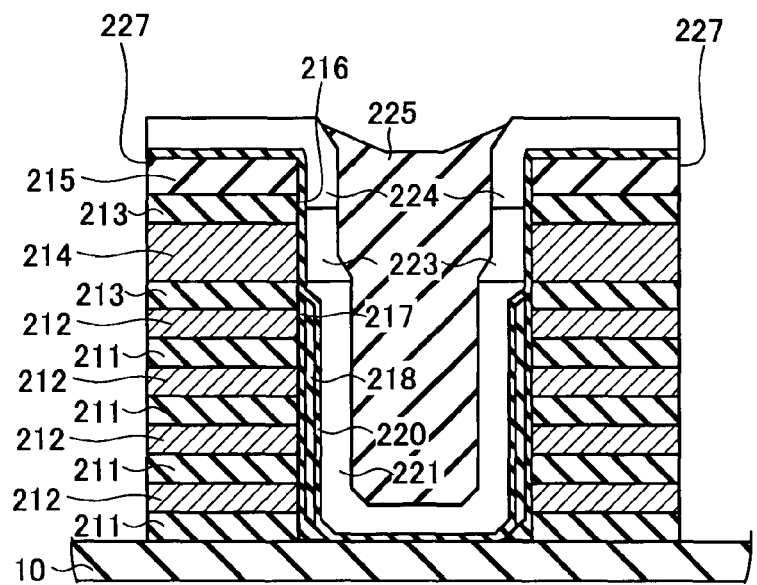
FIG. 10B is a cross-sectional view, taken along line I-I' of FIG. 10A, illustrating a manufacturing process of the non-volatile semiconductor storage device according to the first embodiment of the present invention.

Then, as illustrated in FIGS. 10A and 10B, to electrically separate the first conductive layers 212 in a block adjacent in the x direction, apertures 227 are formed so as to expose the respective edges in the x direction, opposed to the silicon oxide film 217, of the first conductive layers 212, the second conductive layer 214, and the interlayer insulation layers 211, 213, 215.

Figure 11A:
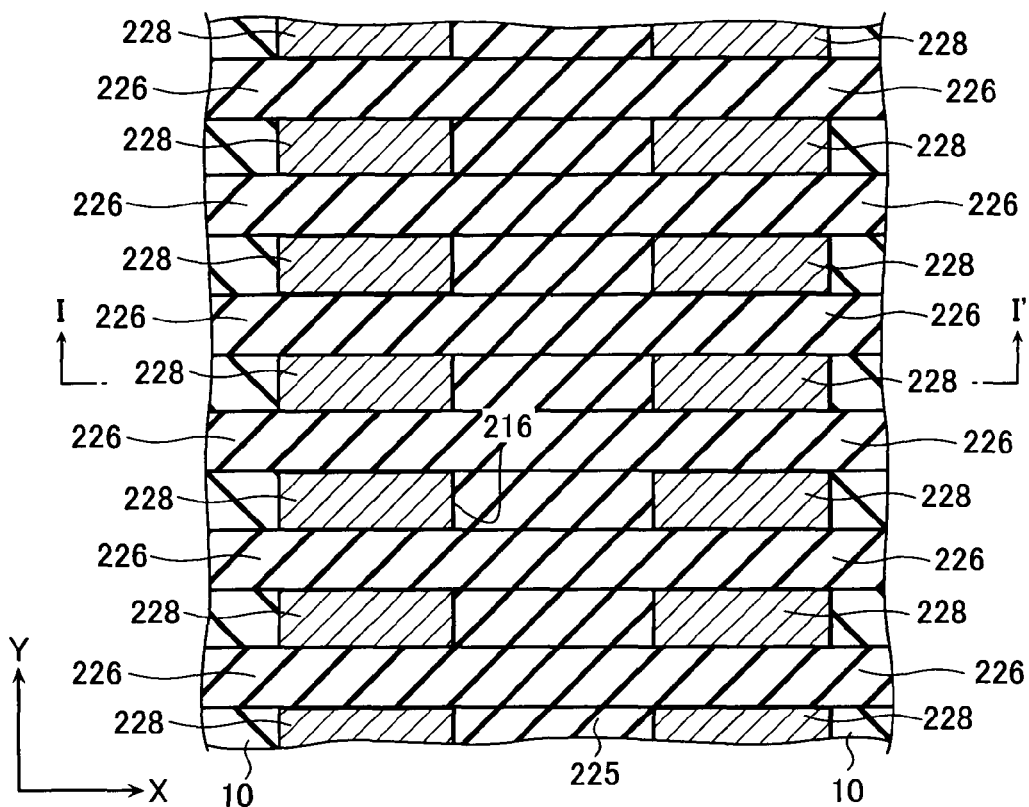
FIG. 11A is a top plan view illustrating a manufacturing process of the non-volatile semiconductor storage device according to the first embodiment of the present invention.
Figure 11B:
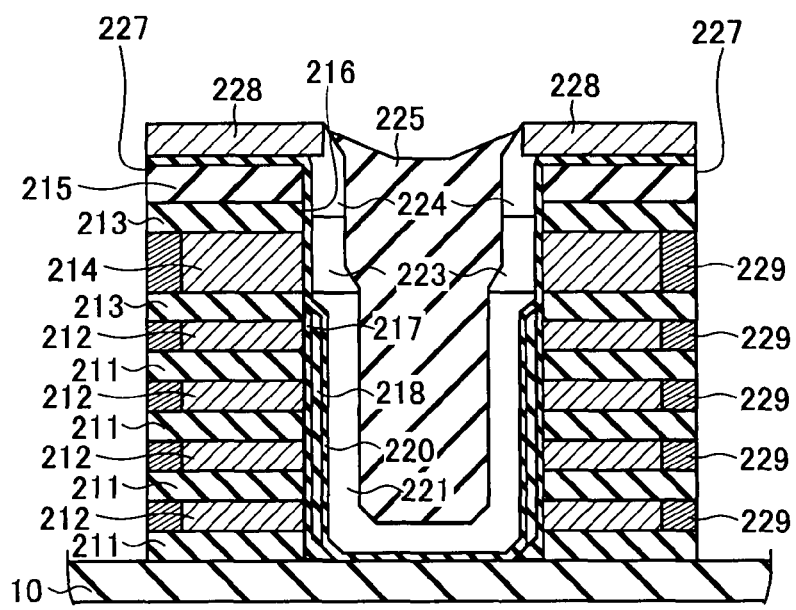
FIG. 11B is a cross-sectional view, taken along line I-I' of FIG. 11A, illustrating a manufacturing process of the non-volatile semiconductor storage device according to the first embodiment of the present invention.

Then, as illustrated in FIGS. 11A and 11B, the upper portions of the exposed $n^+$ type diffusion layers 224, 224 and the edges in the x direction of the exposed first conductive layers 212 are silicidized. As a result, silicide layers 228, 228 are formed on the upper portions of the $n^+$ type diffusion layers 224, 224. That is, the silicide layers 228, 228 become the contact layers 131, 131 after the following process. In addition, through this silicidation, silicide layers 229 are formed on the edges in the x direction of the first conductive layers 212.

Figure 12A:
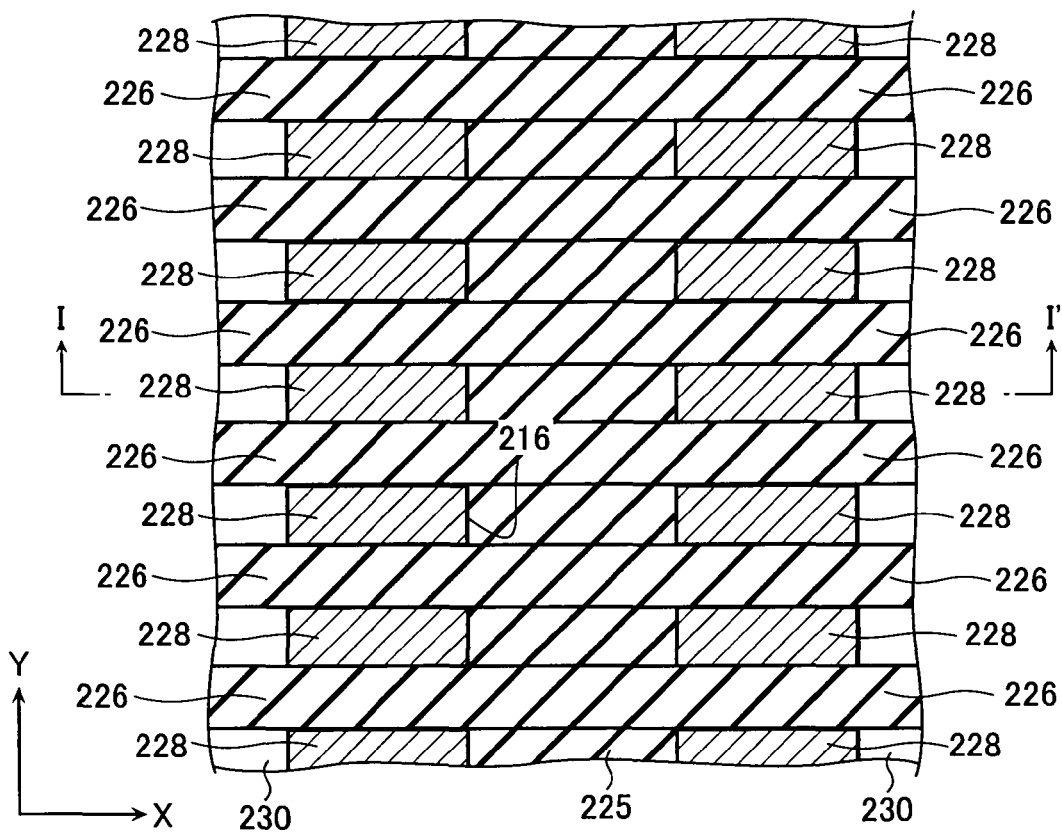
FIG. 12A is a top plan view illustrating a manufacturing process of the non-volatile semiconductor storage device according to the first embodiment of the present invention.
Figure 12B:
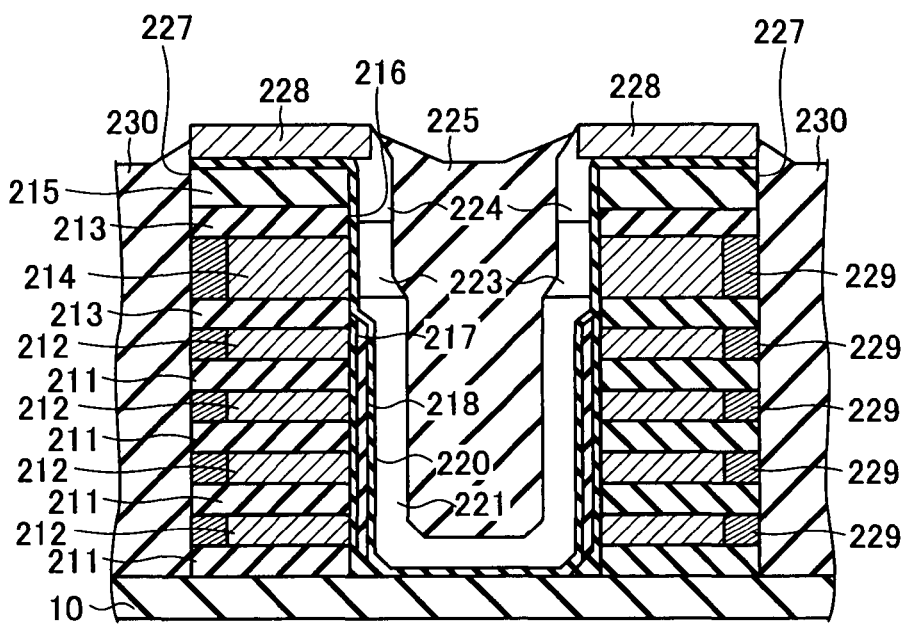
FIG. 12B is a cross-sectional view, taken along line I-I' of FIG. 12A, illustrating a manufacturing process of the non-volatile semiconductor storage device according to the first embodiment of the present invention.

Then, as illustrated in FIGS. 12A and 12B, insulation layers 230 are deposited over the apertures 227. Then, the third lamination parts 130A and 130B are formed and the resulting state is depicted in FIGS. 2A and 2B.

Advantages of Non-Volatile Semiconductor Storage Device According to First Embodiment Advantages of the non-volatile semiconductor storage device according to the first embodiment will now be described below. The non-volatile semiconductor storage device according to the first embodiment allows a reduction in area of the NAND-type flash memory since it has laminated vertical memory cells MC and selection transistors.

Additionally, the non-volatile semiconductor storage device of the first embodiment has the contact layers 131 in rectangular shape, taking the x direction as the longitudinal direction. Further, the non-volatile semiconductor storage device of this embodiment has the contact plug layers 132 that are arranged at different positions (offset) relative to each other in the x direction, rather than arranged in a straight line along the y direction. Thus, intervals are provided between the contact plug layers 132, which may be retain predetermined interval to prevent short circuits between the contact plug layers 132 and malfunctions. In addition, the contact plug layers 132 are arranged in a staggered fashion, allowing margins in the x direction.

Further, it is not necessary to decrease the radius of each contact plug layer 132, which may facilitate the alignment process between the contact plug layers 132 and the contact layers 131. Moreover, as the radius of each contact plug layer 132 not having to be decreased, the contact plug layers 132 are easily processed, and the resistance of the contact plug layers 132 can be kept at a low level.

That is, the non-volatile semiconductor storage device according to the first embodiment may reduce the occupation area and prevent malfunctions.

Second Embodiment

Figure 13A:
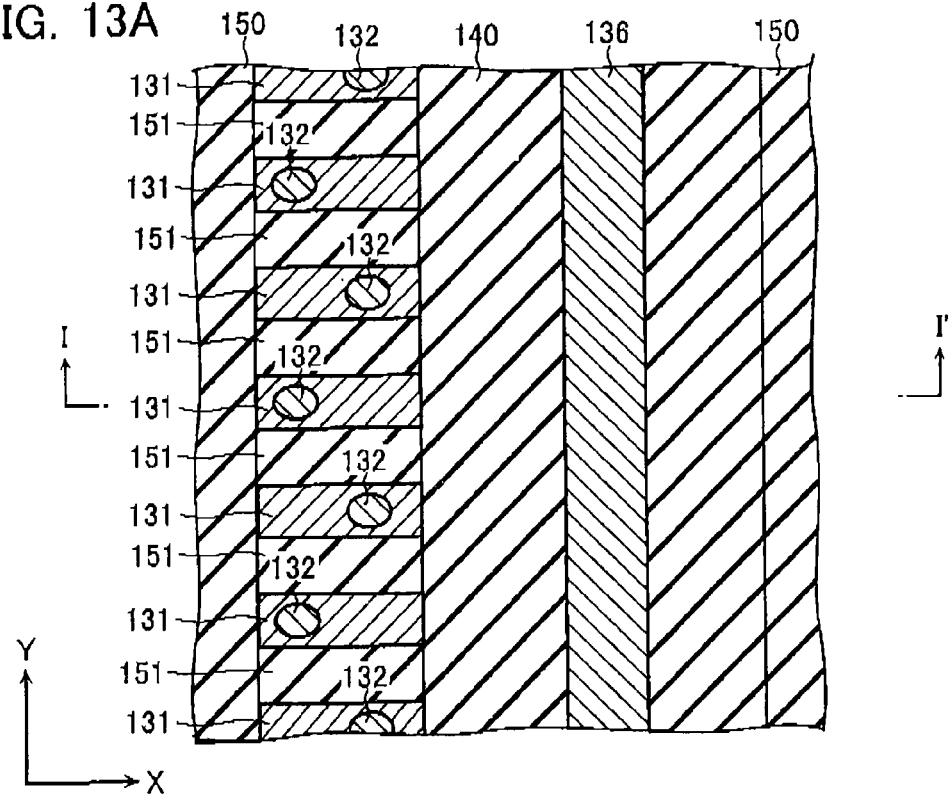
FIG. 13A is a top plan view illustrating a specific configuration of a non-volatile semiconductor storage device according to a second embodiment of the present invention.
Figure 13B:
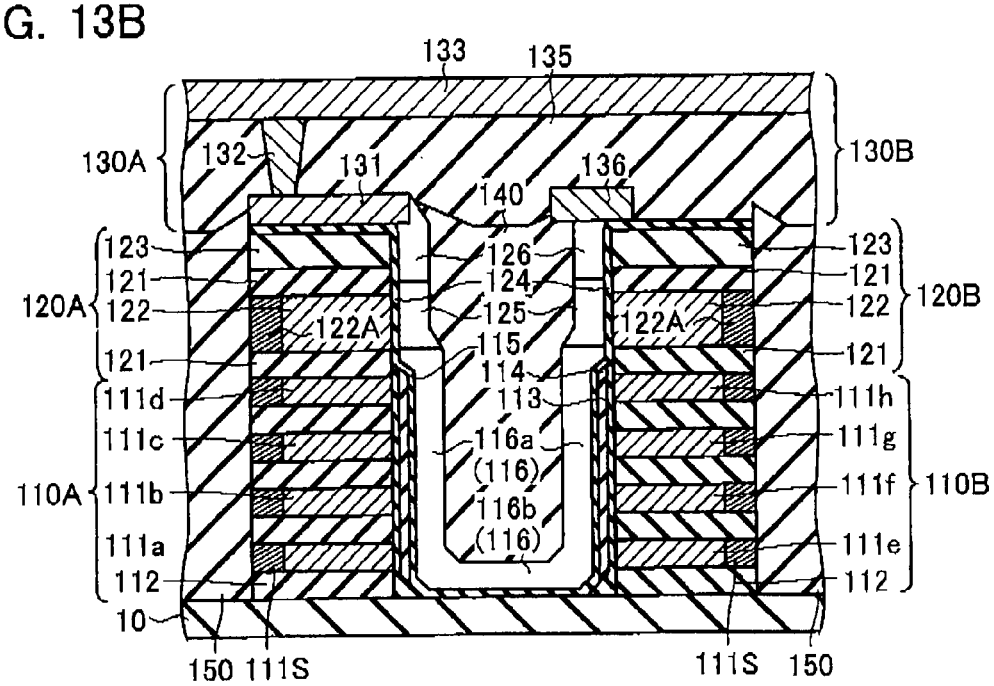
FIG. 13B is a cross-sectional view, taken along line I-I' of FIG. 13A, illustrating a specific configuration of the non-volatile semiconductor storage device according to the second embodiment of the present invention.

Specific Configuration of Non-Volatile Semiconductor Storage Device According to Second Embodiment Referring now to FIGS. 13A and 13B, a specific configuration of a non-volatile semiconductor storage device according to a second embodiment of the present invention will be described below. FIG. 13A is a top plan view of the non-volatile semiconductor storage device according to the second embodiment; and FIG. 13B is a cross-sectional view taken along line I-I' of FIG. 13A. Besides, a bit line BL (a wiring layer 133) provided above these areas and an insulation layer 135, which will be later described, are omitted from FIG. 13A. Note that the same referent numerals represent the same components as the first embodiment and description thereof will be omitted in the second embodiment.

As illustrated in FIGS. 13A and 13B, the non-volatile semiconductor storage device according to the second embodiment has a third lamination part 130B different from that of the first embodiment. The third lamination part 130B has a wiring layer 136, instead of the contact layer 131 and the wiring layer 134 of the first embodiment. The wiring layer 136 is formed to extend to the y direction and in contact with multiple n+ type semiconductor layers 126.

Advantages of Non-Volatile Semiconductor Storage Device According to Second Embodiment The non-volatile semiconductor storage device according to the second embodiment has the contact layers 131 in rectangular shape, taking the x direction as the longitudinal direction. Further, the non-volatile semiconductor storage device of this embodiment has the contact plug layers 132 that are arranged at different positions (offset) relative to each other in the x direction, rather than arranged in a straight line along the y direction. Accordingly, the non-volatile semiconductor storage device according to the second embodiment has the same advantages as the first embodiment. In addition, the non-volatile semiconductor storage device according to the second embodiment may be manufactured easier than the first embodiment, due to the existence of the wiring layer 136.

Third Embodiment

Figure 14A:
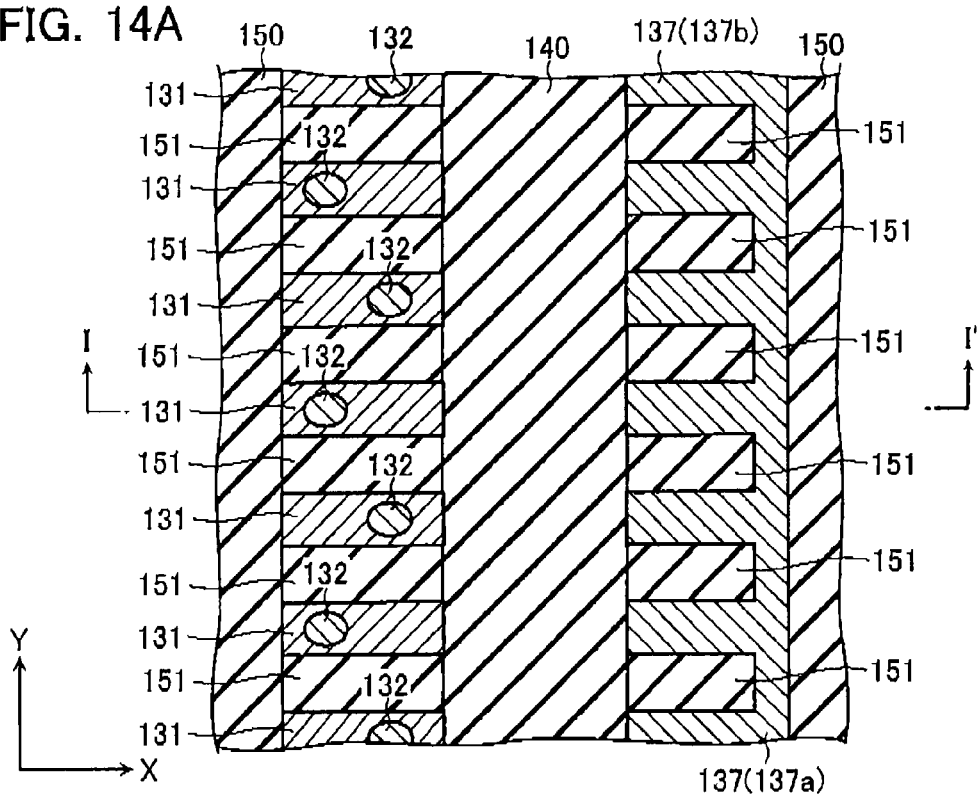
FIG. 14A is a top plan view illustrating a specific configuration of a non-volatile semiconductor storage device according to a third embodiment of the present invention.
Figure 14B:
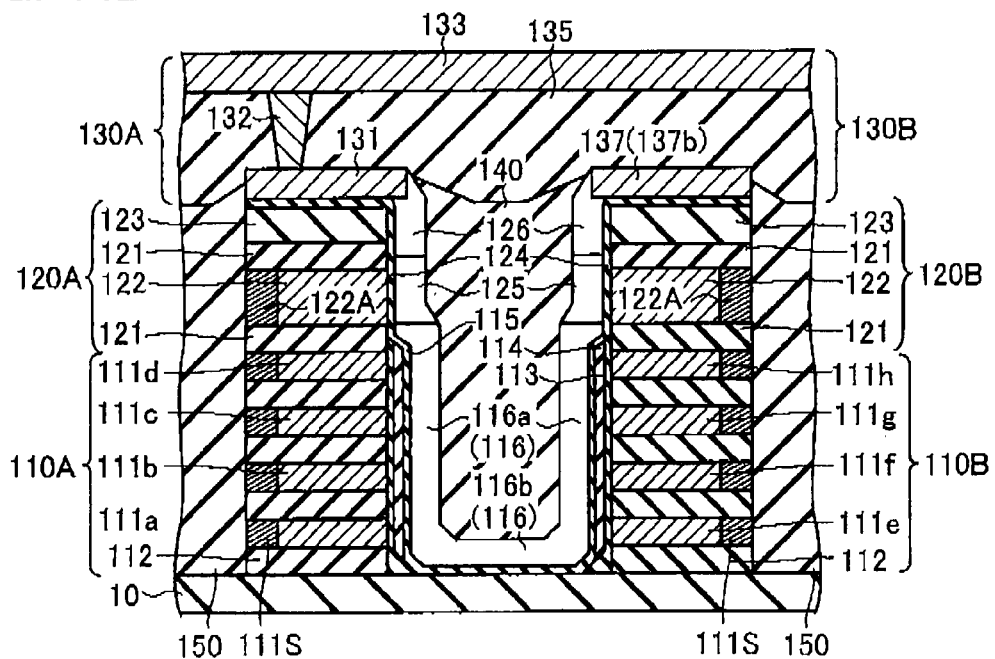
FIG. 14B is a cross-sectional view, taken along line I-I' of FIG. 14A, illustrating a specific configuration of the non-volatile semiconductor storage device according to the third embodiment of the present invention.

Specific Configuration of Non-Volatile Semiconductor Storage Device According to Third Embodiment Referring now to FIGS. 14A and 14B, a specific configuration of a non-volatile semiconductor storage device according to a third embodiment of the present invention will be described below. FIG. 14A is a top plan view of the non-volatile semiconductor storage device according to the third embodiment; and FIG. 14B is a cross-sectional view taken along line I-I' of FIG. 14A. Besides, a bit line BL (a wiring layer 133) provided above these areas and an insulation layer 135, which will be later described, are omitted from FIG. 14A. Note that the same referent numerals represent the same components as the first embodiment and description thereof will be omitted in the third embodiment.

As illustrated in FIGS. 14A and 14B, the non-volatile semiconductor storage device according to the third embodiment has a third lamination part 130B different from those of the first and second embodiments. The third lamination part 130B has a wiring layer 137 in comb-teeth shape, instead of the contact layer 131 and the wiring layer 134. The wiring layer 137 has a base portion 137a that extends to the y direction and protrusion portions 137b that protrude from the base portion 137a to the x direction and come in contact with respective n+ type semiconductor layers 126.

Advantages of Non-Volatile Semiconductor Storage Device According to Third Embodiment The non-volatile semiconductor storage device according to the third embodiment has the contact layers 131 in rectangular shape, taking the x direction as the longitudinal direction. Further, the non-volatile semiconductor storage device of this embodiment has the contact plug layers 132 that are arranged at different positions (offset) relative to each other in the x direction, rather than arranged in a straight line along the y direction. Accordingly, the non-volatile semiconductor storage device according to the second embodiment has the same advantages as the first embodiment. In addition, the non-volatile semiconductor storage device according to the second embodiment may be manufactured easier than the first and second embodiments, due to the existence of the wiring layer 137.

Fourth Embodiment

Figure 15A:
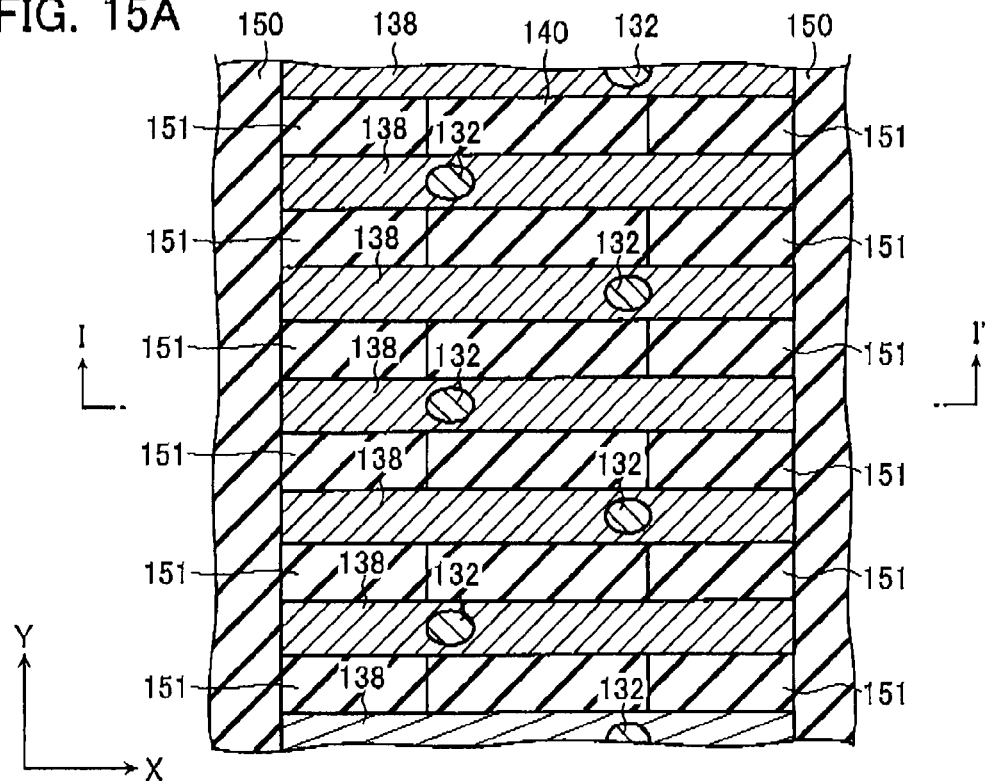
FIG. 15A is a top plan view illustrating a specific configuration of a non-volatile semiconductor storage device according to a fourth embodiment of the present invention.
Figure 15B:
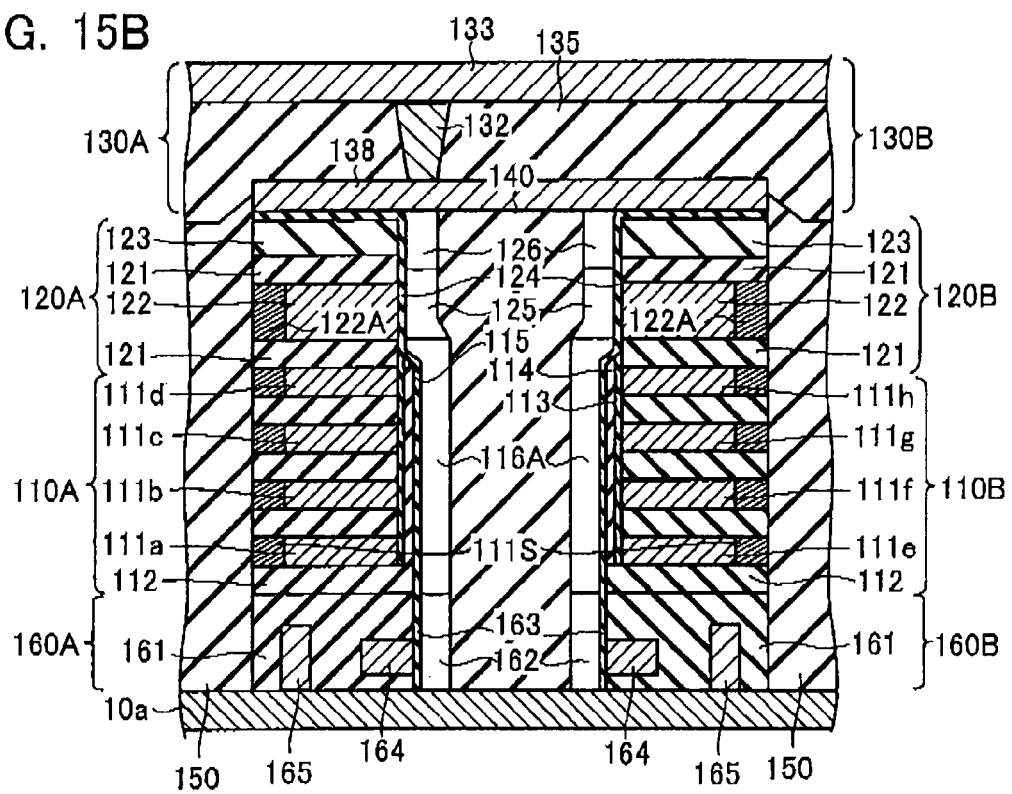
FIG. 15B is a cross-sectional view, taken along line I-I' of FIG. 15A, illustrating a specific configuration of the non-volatile semiconductor storage device according to the fourth embodiment of the present invention.

Specific Configuration of Non-Volatile Semiconductor Storage Device According to Fourth Embodiment Referring now to FIG. 15A and FIG. 15B, a specific configuration of a non-volatile semiconductor storage device according to a fourth embodiment of the present invention will be described below. FIG. 15A is a top plan view of the non-volatile semiconductor storage device according to the fourth embodiment; and FIG. 15B is a cross-sectional view taken along line I-I' of FIG. 15A. Besides, a bit line BL (a wiring layer 133) provided above these areas and an insulation layer 135, which will be later described, are omitted from FIG. 15A. Note that the same referent numerals represent the same components as the first to third embodiments and description thereof will be omitted in the fourth embodiment.

As illustrated in FIG. 15A and FIG. 15B, the non-volatile semiconductor storage device according to the fourth embodiment has a different configuration than that of the first embodiment in its first lamination parts 110A, 110B and third lamination parts 130A, 130B. In addition, fourth lamination parts 160A and 160B are formed between the first lamination parts 110A, 110B and a substrate 10a. The substrate 10a is composed of a conductive layer. For example, the substrate 10a is composed of Aluminum (Al), copper (Cu), platinum (Pt), gold (Au), silver (Ag), tungsten (W), nickel (Ni), cobalt (Co), titanium (Ti), tantalum (Ta), monocrystalline silicon, multicrystalline silicon, or silicide layer (metal).

Each of the first lamination parts 110A and 110B has an n−type semiconductor layer 116A with a configuration from which the bottom portion 116b of the n⁻ type semiconductor layer 116 is omitted, instead of the U-shaped n⁻ type semiconductor layer 116 of the first embodiment. That is, each of the n− type semiconductor layers 116A has an I-shaped cross-section in the direction of I-I'.

Each of the third lamination parts 130A and 130B has a contact layer 138 in rectangular shape that is common to the third lamination parts 130A and 130B and extends to the x direction, instead of the contact layers 131, 131. Each contact layer 138 is connected to the respective n+ type semiconductor layers 126, 126 in the respective second lamination parts 120A and 120B.

Each contact plug layer 132 is formed to extend to the lamination direction on the top surface of the respective contact layer 138. As illustrated in FIG. 2A, the contact plug layers 132 are arranged at different positions (offset) relative to each other in the x direction, rather than arranged in a straight line along the y direction. In FIG. 15A, the contact plug layers 132 are arranged in a staggered fashion.

Each of the fourth lamination parts 160A and 160B has an interlayer insulation layer 161 that is formed below the first interlayer insulation layer 112 (bottom layer), an n⁻ type semiconductor layer 162 that is formed in contact with the bottom parts of the n type semiconductor layers 116A and extends to the lamination direction, and a gate insulation layer 163 that is formed between the n⁻ type semiconductor layer 162 and the interlayer insulation layer 161.

In addition, each of the fourth lamination parts 160A and 160B has a gate conductive layer 164 that is formed adjacent to the gate insulation layer 163 and a wiring layer 165 that is connected to the n⁻ type semiconductor layer 162. The wiring layers 165 function as the source lines SL. Thus, the fourth lamination parts 160A and 160B have functions as source-side selection transistors SGS.

That is, unlike the first and second embodiments, the fourth embodiment has a configuration where source-side selection transistors SGS are arranged in a lower layer of the lamination structure.

Advantages of Non-Volatile Semiconductor Storage Device According to Fourth Embodiment The non-volatile semiconductor storage device of the fourth embodiment has contact layers 138 in rectangular shape, taking the x direction as the longitudinal direction. Further, the non-volatile semiconductor storage device of this embodiment has the contact plug layers 132 that are arranged at different positions (offset) relative to each other in the x direction, rather than arranged in a straight line along the y direction. Accordingly, the non-volatile semiconductor storage device according to the fourth embodiment has the same advantages as the first embodiment.

Fifth Embodiment

Figure 16:
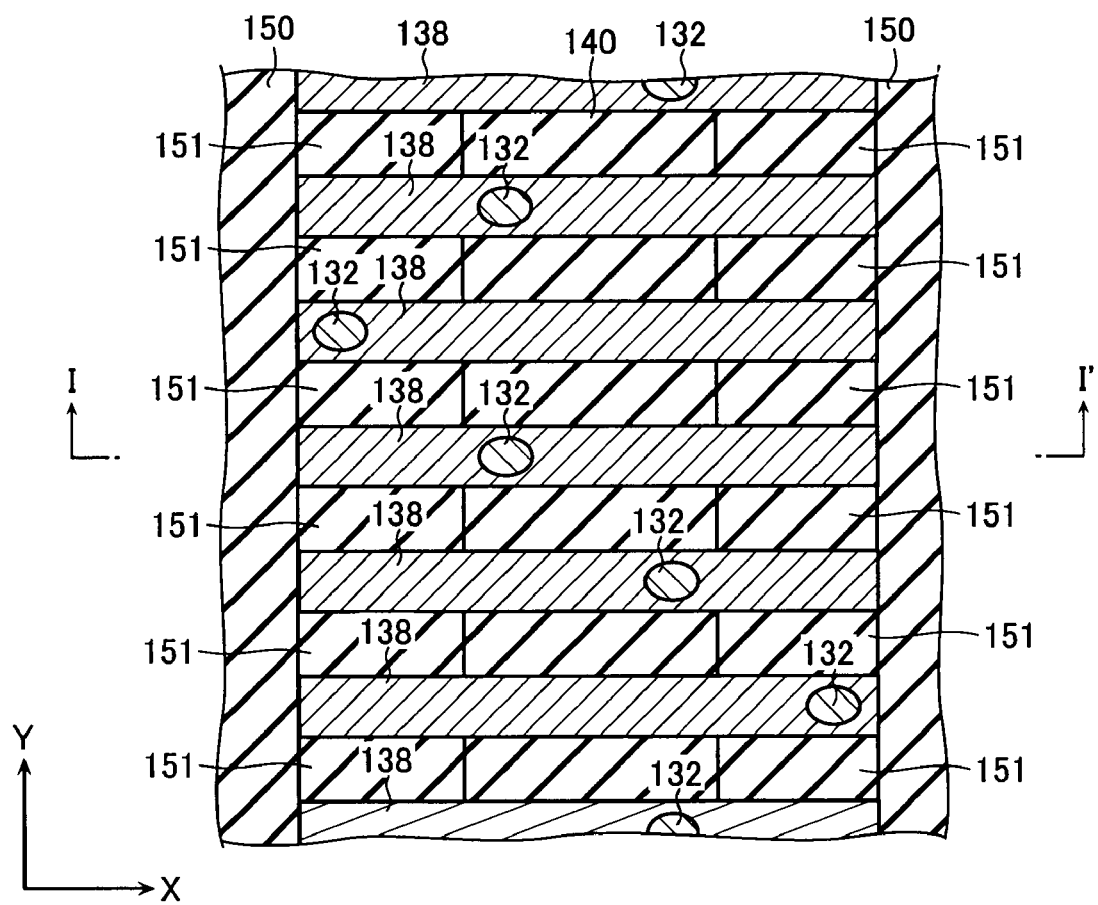
FIG. 16 is a top plan view illustrating a specific configuration of a non-volatile semiconductor storage device according to a fifth embodiment of the present invention.

Specific Configuration of Non-Volatile Semiconductor Storage Device According to Fifth Embodiment Referring now to FIG. 16, a specific configuration of a non-volatile semiconductor storage device according to a fifth embodiment of the present invention will be described below. FIG. 16 is a top plan view of the non-volatile semiconductor storage device according to the fifth embodiment. Note that a bit line BL (a wiring layer 133) provided above these areas and an insulation layer 135, which will be later described, are omitted from FIG. 16.

As illustrated in FIG. 16, the non-volatile semiconductor storage device according to the fifth embodiment is different from the fourth embodiment only in the arrangement of the contact plug layers 132. Note that the same referent numerals represent the same components as the first to fourth embodiments and description thereof will be omitted in the fifth embodiment.

As illustrated in FIG. 16, each contact plug layer 132 is arranged at a selected one of four positions in the x direction in each of the contact layers 138, instead of being arranged in a staggered fashion. Note that the contact plug layers 132 are not arranged at the same position in the x direction on the adjacent contact layers 138.

Advantages of Non-Volatile Semiconductor Storage Device According to Fifth Embodiment The non-volatile semiconductor storage device according to the fifth embodiment has contact layers 138 in rectangular shape, taking the x direction as the longitudinal direction. Further, the non-volatile semiconductor storage device of this embodiment has the contact plug layers 132 that are arranged at different positions (offset) relative to each other in the x direction, rather than arranged in a straight line along the y direction. Accordingly, the non-volatile semiconductor storage device according to the fifth embodiment has the same advantages as the first embodiment.

Sixth Embodiment

Figure 17A:
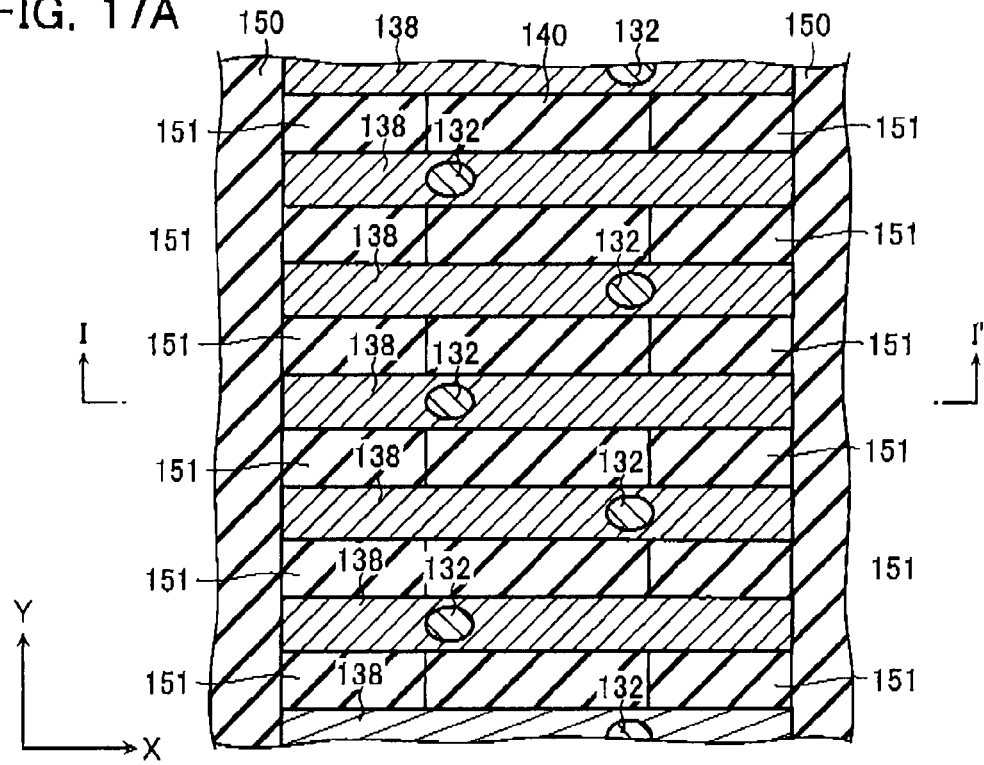
FIG. 17A is a top plan view illustrating a specific configuration of a non-volatile semiconductor storage device according to a sixth embodiment of the present invention.
Figure 17B:
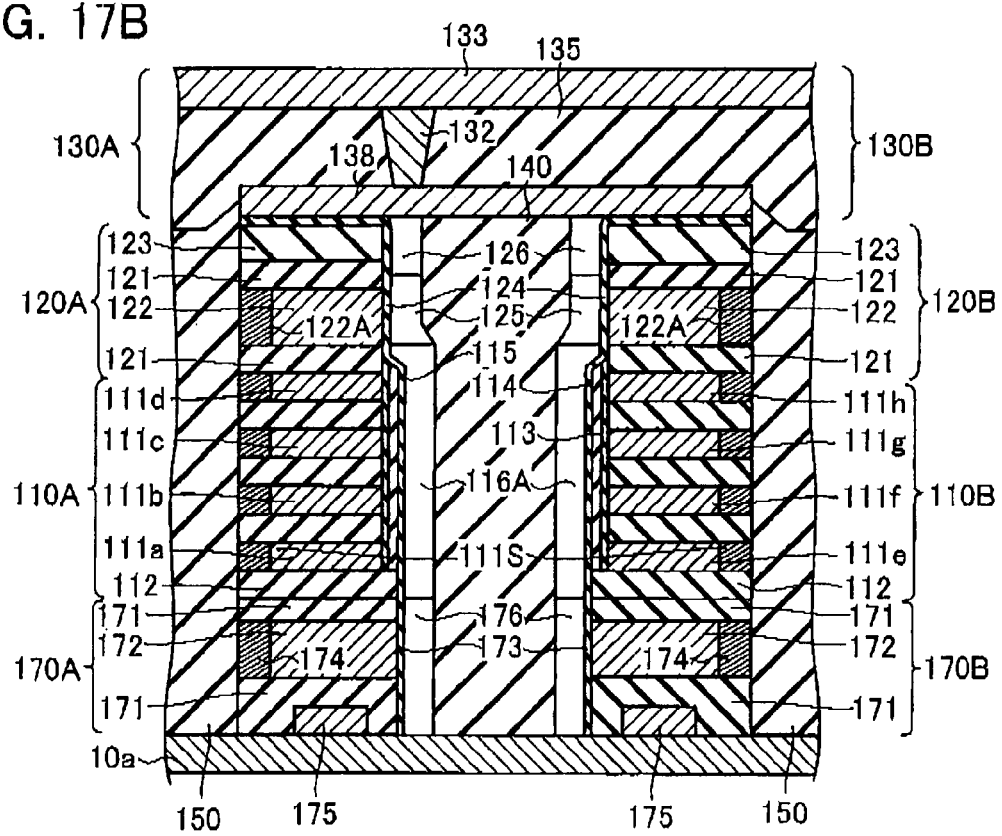
FIG. 17B is a cross-sectional view, taken along line I-I' of FIG. 17A, illustrating a specific configuration of the non-volatile semiconductor storage device according to the sixth embodiment of the present invention.

Specific Configuration of Non-Volatile Semiconductor Storage Device According to Sixth Embodiment Referring now to FIG. 17A and FIG. 17B, a specific configuration of a non-volatile semiconductor storage device according to a sixth embodiment of the present invention will be described below. FIG. 17A is a top plan view of the non-volatile semiconductor storage device according to the sixth embodiment; and FIG. 17B is a cross-sectional view taken along line I-I' of FIG. 17A. Note that a bit line BL (a wiring layer 133) provided above these areas and an insulation layer 135, which will be later described, are omitted from FIG. 17A. Note that the same referent numerals represent the same components as the first to fifth embodiments and description thereof will be omitted in the sixth embodiment.

As illustrated in FIGS. 17A and 17B, the non-volatile semiconductor storage device according to the sixth embodiment has fifth lamination parts 170A and 170B, instead of the fourth lamination parts 160A and 160B of the fourth embodiment, and other configurations are the same as the fourth embodiment.

Each of the fifth lamination parts 170A and 170B is configured by lamination of an interlayer insulation layer 171, a conductive layer 172, and another interlayer insulation layer 171 (from the bottom). A gate insulation layer 173 is provided on the respective side surfaces of the interlayer insulation layers 171, the conductive layers 172, and the other interlayer insulation layers 171. The conductive layers 172 have silicide layers 174 formed at their respective side surfaces opposed to the end where the gate insulation layers 173 are located. In addition, wiring layers 175 are provided in the interlayer insulation layers 171 (bottom layer) that extend to the y direction. The wiring layers 175 function as the source lines SL. In addition, each of the fifth lamination parts 170A and 170B has an n– type semiconductor layer 176 that is formed to extend to the lamination direction and come in contact with the bottom parts of the n– type semiconductor layers 116A.

Advantages of Non-Volatile Semiconductor Storage Device According to Sixth Embodiment The non-volatile semiconductor storage device according to the sixth embodiment has contact layers 138 in rectangular shape, taking the x direction as the longitudinal direction. Further, the non-volatile semiconductor storage device of this embodiment has the contact plug layers 132 that are arranged at different positions (offset) relative to each other in the x direction, rather than arranged in a straight line along the y direction. Accordingly, the non-volatile semiconductor storage device according to the sixth embodiment has the same advantages as the first embodiment.

Figure 18:
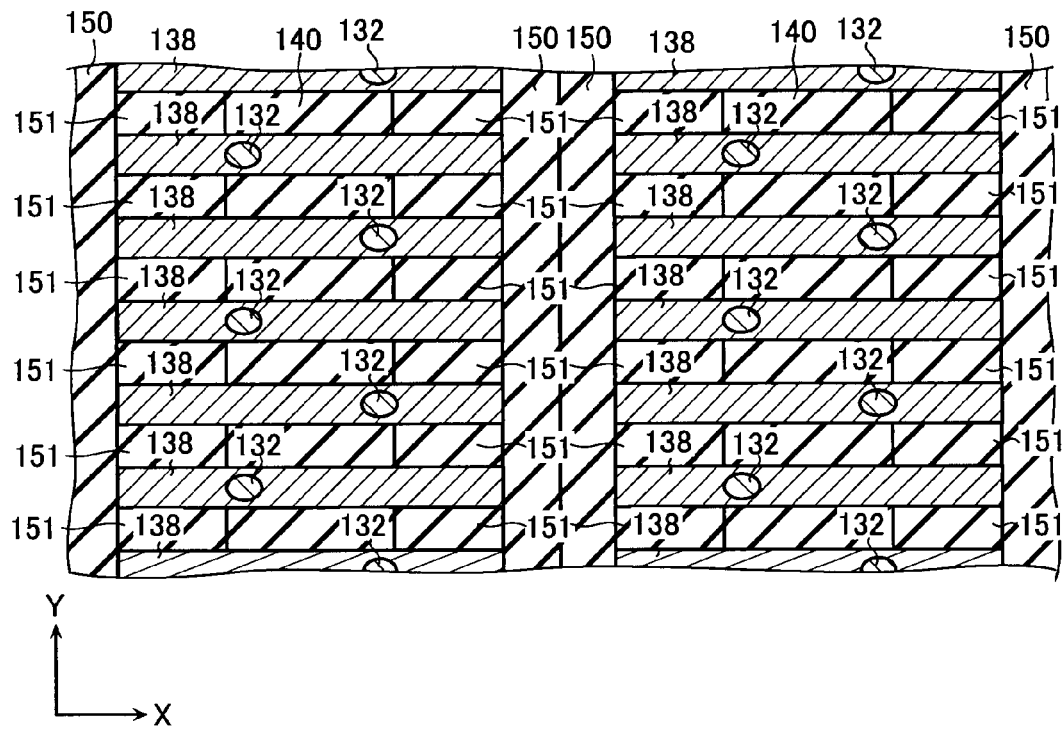
FIG. 18 is a top plan view illustrating a specific configuration of a non-volatile semiconductor storage device according to another embodiment of the present invention.
Figure 19:
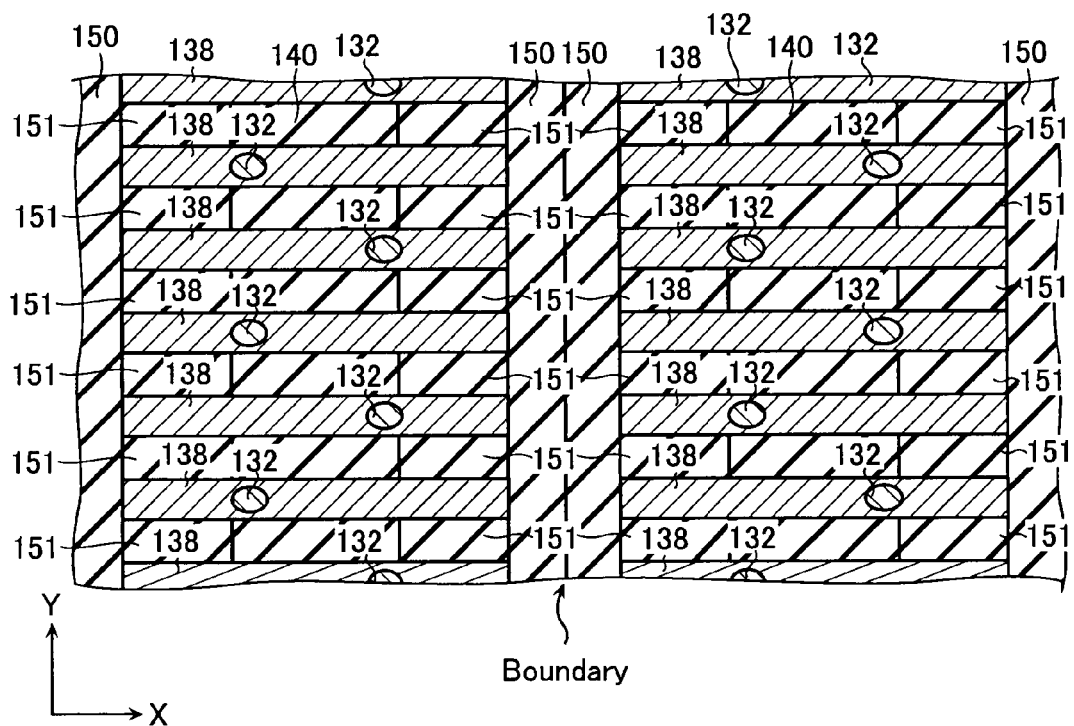
FIG. 19 is a top plan view illustrating a specific configuration of a non-volatile semiconductor storage device according to still another embodiment of the present invention.

While embodiments of the non-volatile semiconductor storage device have been described, the present invention is not intended to be limited to the disclosed embodiments and various other changes, additions, replacements or the like may be made thereto without departing from the spirit of the invention. For example, as illustrated in FIG. 18, in the units adjacent to each other in the x direction, the contact plug layers 132 in the respective unit may be arranged to be shifted in parallel along the x direction. In addition, as illustrated in FIG. 19, in the units adjacent to each other in the x direction, the contact plug layers 132 in the respective unit may be arranged in mirror symmetry with respect to the boundary in between.

What is claimed is:

1. A non-volatile semiconductor storage device comprising:
   a first lamination part having first insulation layers and first conductive layers alternately laminated therein;
   a second lamination part provided on a top surface of the first lamination part and laminated so as to form a second conductive layer between second insulation layers; and
   a third lamination part located on either the respective first or second lamination part,
   the first lamination part comprising:
   a third insulation layer provided in contact with the respective sidewalls of the first insulation layers and the first conductive layers;
   a charge accumulation layer provided in contact with the third insulation layer and accumulating charges;
   a fourth insulation layer provided in contact with the charge accumulation layer; and
   a first semiconductor layer provided in contact with the fourth insulation layer and formed to extend in the lamination direction, the first semiconductor layer being formed in U-shape as viewed from a second direction perpendicular to the lamination direction;
   the second lamination part comprising:
   a fifth insulation layer provided in contact with the respective sidewalls of the second insulation layers and the second conductive layer; and
   a second semiconductor layer provided in contact with the fifth insulation layer and the first semiconductor layer and formed to extend in the lamination direction;
   the third lamination part comprising:
   a plurality of first contact layers formed in contact with one end of the first semiconductor layer via the second semiconductor layer, extending in a first direction perpendicular to the lamination direction and in line with each other along the second direction;
   a plurality of contact plug layers formed in contact with any one of the first contact layers and extending in the lamination direction;
   a second contact layer in contact with another end of the first semiconductor layer via the second semiconductor layer and extending in the first direction; and
   a first wiring layer in contact with the second contact layer and extending in the second direction,
   wherein the contact plug layers are arranged at different positions relative to each other in the first direction.

2. The non-volatile semiconductor storage device according to claim 1, wherein
   the contact plug layers are arranged in a staggered fashion.

3. The non-volatile semiconductor storage device according to claim 1, wherein
   the first lamination part, the second lamination part, and the third lamination part are formed to be spaced apart by a predetermined pitch in the first direction for each unit corresponding to a unit of erasing.

4. The non-volatile semiconductor storage device according to claim 1, wherein
   the first semiconductor layer is a first conductive-type semiconductor; and
   the second semiconductor layer is a second conductive-type semiconductor.

5. The non-volatile semiconductor storage device according to claim 1, further comprising:
   silicide layers formed on edges of the first conductive layers in the first direction.

* * * * *